(12) United States Patent
Khaderbad et al.

(10) Patent No.: US 12,532,716 B2
(45) Date of Patent: *Jan. 20, 2026

(54) LOW THERMAL BUDGET DIELECTRIC FOR SEMICONDUCTOR DEVICES

(71) Applicant: Taiwan Semiconductor Manufacturing Company, Ltd., Hsinchu (TW)

(72) Inventors: Mrunal Abhijith Khaderbad, Hsinch (TW); Ko-Feng Chen, Hsinchu (TW); Zheng-Yong Liang, Hsinchu (TW); Chen-Han Wang, Zhubei (TW); De-Yang Chiou, Hsinchu (TW); Yu-Yun Peng, Hsinchu (TW); Keng-Chu Lin, Ping-Tung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/427,575

(22) Filed: Jan. 30, 2024

(65) Prior Publication Data

US 2024/0170323 A1 May 23, 2024

Related U.S. Application Data

(63) Continuation of application No. 17/200,223, filed on Mar. 12, 2021, now Pat. No. 11,942,358.

(51) Int. Cl.
*H01L 21/762* (2006.01)
*H01L 21/311* (2006.01)
*H10D 84/01* (2025.01)
*H10D 84/03* (2025.01)

(52) U.S. Cl.
CPC .. *H01L 21/76224* (2013.01); *H01L 21/31116* (2013.01); *H10D 84/0151* (2025.01); *H10D 84/038* (2025.01)

(58) Field of Classification Search
CPC .......... H10D 84/0158; H10D 84/0151; H10D 84/013; H01L 21/76224; H01L 21/31116
See application file for complete search history.

(56) References Cited

U.S. PATENT DOCUMENTS

| | | | |
|---|---|---|---|
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |

(Continued)

FOREIGN PATENT DOCUMENTS

| | | |
|---|---|---|
| JP | 2002075971 A | 3/2002 |
| WO | WO 2018039645 A1 | 3/2018 |

*Primary Examiner* — Monica D Harrison
*Assistant Examiner* — Jacob T Nelson
(74) *Attorney, Agent, or Firm* — Sterne, Kessler, Goldstein & Fox P.L.L.C.

(57) ABSTRACT

The present disclosure describes a method of forming low thermal budget dielectrics in semiconductor devices. The method includes forming, on a substrate, first and second fin structures with an opening in between, filling the opening with a flowable isolation material, treating the flowable isolation material with a plasma, and removing a portion of the plasma-treated flowable isolation material between the first and second fin structures.

20 Claims, 16 Drawing Sheets

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,303 B2 | 1/2017 | Lee et al. | |
| 9,548,366 B1 | 1/2017 | Ho et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,831,183 B2 | 11/2017 | Lin et al. | |
| 9,859,386 B2 | 1/2018 | Ho et al. | |
| 11,942,358 B2 * | 3/2024 | Khaderbad | H10D 84/0151 |
| 2006/0205202 A1 | 9/2006 | Chung | |
| 2009/0053895 A1 | 2/2009 | Oshima et al. | |
| 2014/0134824 A1 * | 5/2014 | Chen | H01L 21/3105 |
| | | | 438/692 |
| 2015/0056381 A1 | 2/2015 | Hori et al. | |
| 2015/0303118 A1 * | 10/2015 | Wang | H10D 84/0151 |
| | | | 257/401 |
| 2019/0139836 A1 | 5/2019 | Chu et al. | |
| 2021/0280451 A1 * | 9/2021 | Lee | H01L 21/76224 |
| 2022/0293458 A1 | 9/2022 | Khaderbad et al. | |

* cited by examiner

LOW THERMAL BUDGET DIELECTRIC FOR SEMICONDUCTOR DEVICES

CROSS-REFERENCE TO RELATED APPLICATION

This application is a continuation application of U.S. patent application Ser. No. 17/200,223, filed on Mar. 12, 2021, titled "Low Thermal Budget Dielectric for Semiconductor Devices," the entire contents of which are incorporated herein by reference.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around field effect transistors (GAAFETs). Such scaling down has introduced challenges to improve the performance of semiconductor devices.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
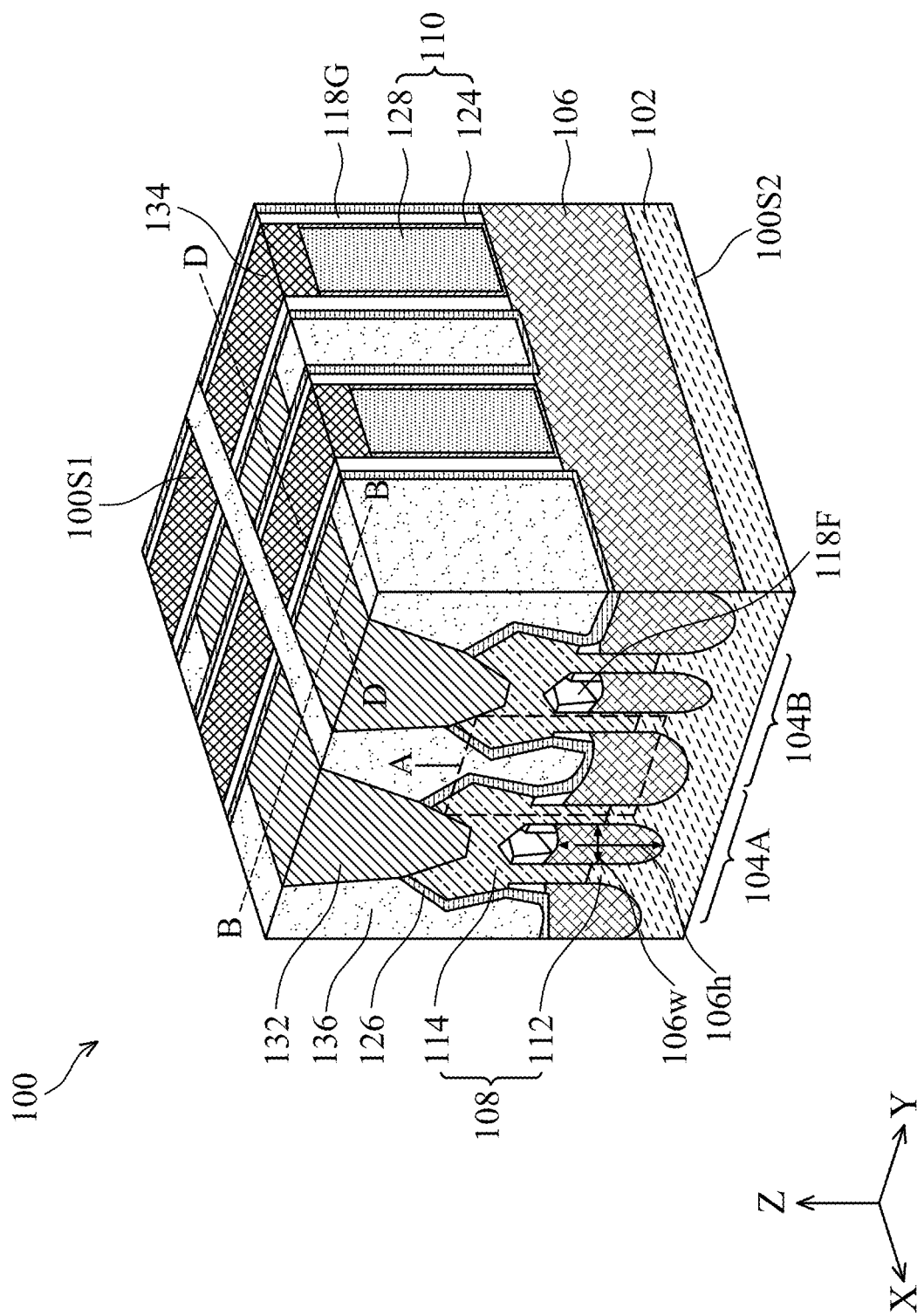
FIGS. 1 and 2 are isometric and partial cross-sectional views, respectively, of a semiconductor device having low thermal budget dielectrics, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The scaling down of field effect transistor (FET) devices has increased the complexity of semiconductor manufacturing processes and increased manufacturing cost. Dielectrics, such as oxides, on the FET devices can be deposited by plasma enhanced chemical vapor deposition (PECVD), atomic layer deposition (ALD), flowable chemical vapor deposition (FCVD) followed by a high temperature anneal, and other suitable deposition methods. PECVD and ALD provide conformal deposition, which can form voids and seams in deposited dielectrics. Additional processes, such as repeated cycles of deposition and etch, can remove voids and seams. However, these additional processes can lower manufacturing capacity and increase manufacturing cost. FCVD can reduce seams and voids in the deposited dielectrics. However, a required high temperature anneal after FCVD can be from about 600° C. to about 900° C. for about 1 hour to about 4 hours, which can be a high thermal budget and can increase manufacturing cost. In addition, the high temperature anneal can cause damage to the FET devices and degrade device performance, such as fin bending, silicon (Si) and silicon germanium (SiGe) intermixing in stacked fins, and cause oxidation of layers under the deposited dielectrics (also referred to as "under layer oxidation"). Moreover, advanced power distribution schemes (e.g., frontside and backside power distribution network) require lower processing temperatures (e.g., lower than about 400° C.) to avoid degrading device performance.

Various embodiments in the present disclosure provide example methods for forming low thermal budget dielectrics in FET devices (e.g., finFETs, gate-all-around (GAA) FETs, MOSFETs, etc.) and/or other semiconductor devices in an integrated circuit (IC) and example semiconductor devices fabricated with the same methods. The example methods in the present disclosure can include forming, on a substrate, first and second fin structures with an opening in between. A flowable isolation material (e.g., flowable oxide) can fill the opening with a flowable deposition method. The flowable isolation material can be treated with oxygen radicals of a plasma at a low temperature from about 200° C. to about 500° C. In some embodiments, the flowable isolation material can be treated with a mixture of oxygen radicals and hydrogen radicals. Low thermal budget dielectrics can be formed by deposition of the flowable isolation material followed by the low temperature plasma treatment. In some embodiments, the low thermal budget dielectrics can reduce the presence of or have no voids or seams due to the flowable isolation material. In some embodiments, with the low temperature plasma treatment, the low thermal budget dielectrics can reduce defects, such as fin bending and Si and SiGe intermixing in stacked fins.

In some embodiments, first and second epitaxial structures can be formed on respective first and second fin structures. An etch stop layer can be formed on the first and second epitaxial structures. A dielectric layer including flowable dielectric materials can be deposited on the etch stop layer by a flowable deposition method. The dielectric layer can be treated by a plasma with oxygen radicals at a low temperature from about 200° C. to about 400° C. to form low thermal budget dielectrics. In some embodiments, the dielectric layer can reduce the presence of or have no voids or seams due to the flowable dielectric materials. In some embodiments, the etch stop layer can improve the prevention of under layer oxidation with the low temperature plasma treatment. In some embodiments, an additional flowable isolation material can be deposited on an opposite side of the substrate. The additional flowable isolation material can be treated by a plasma with oxygen radicals at a low temperature from about 200° C. to about 400° C. to form low thermal budget dielectrics. In some embodiments, with the low temperature plasma treatment, the low thermal budget dielectrics can reduce or prevent device degradation for advanced power distribution schemes.

Figure 2:
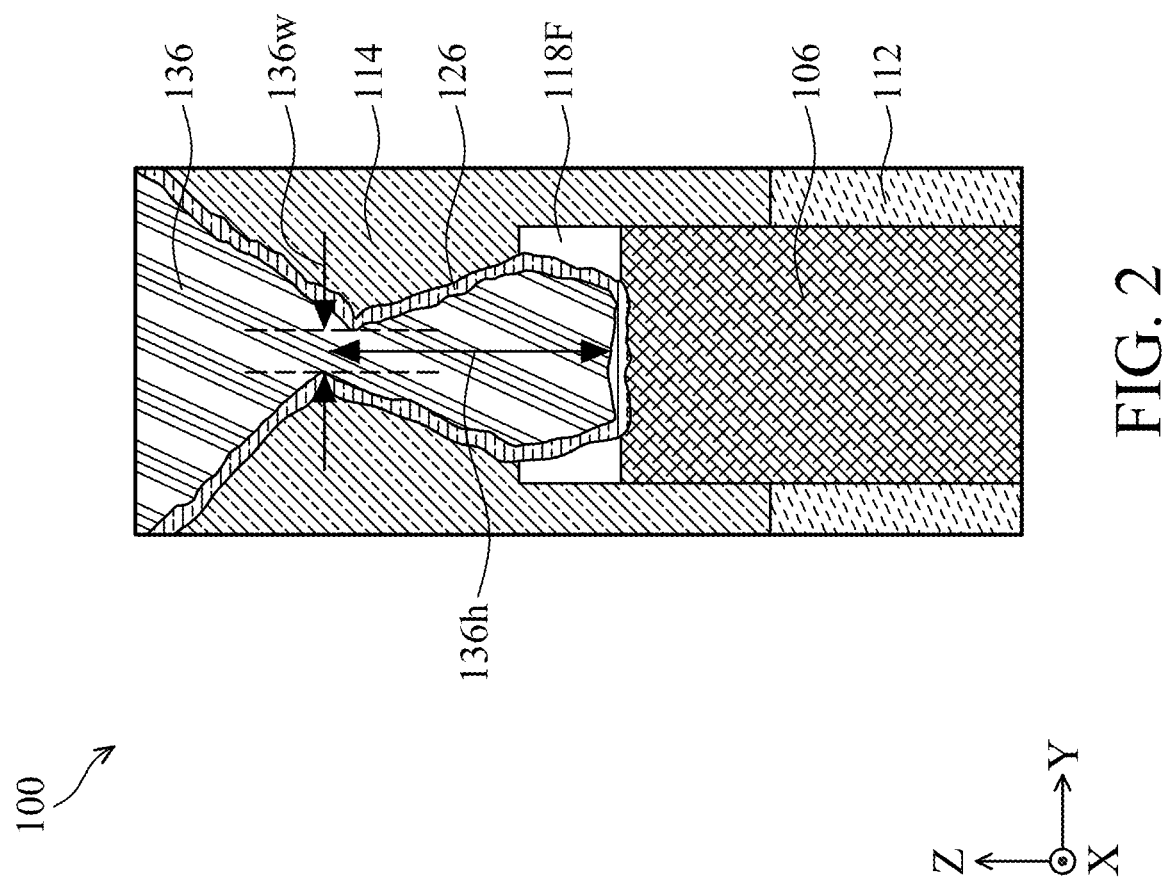

A semiconductor device 100 is described with reference to FIGS. 1 and 2, according to some embodiments. FIG. 1 is an isometric view of semiconductor device 100, according to some embodiments. FIG. 2 illustrates a partial cross-sectional view of an area A of semiconductor device 100 of FIG. 1, according to some embodiments. Semiconductor device 100 can be included in a microprocessor, memory cell, or other integrated circuit (IC). The isometric and cross-sectional views of semiconductor device 100 are shown for illustration purposes and may not be drawn to scale.

Semiconductor device 100 can be formed on a substrate 102 and can include finFETs 104A and 104B as shown in FIG. 1. In some embodiments, finFET 104A can be an NFET (also referred to as NFET 104A) and finFET 104B can be a PFET (also referred to as PFET 104B). In some embodiments, finFETs 104A and 104B can be both NFETs or both PFETs. Though FIG. 1 shows one NFET 104A and one PFET 104B, semiconductor device 100 can have any number of NFETs similar to NFET 104A and any number of PFETs similar to PFET 104B. The discussion of elements of finFET 104A and 104B with the same annotations applies to each other, unless mentioned otherwise. In addition, semiconductor device 100 can be incorporated into an IC through the use of other structural components, such as conductive vias, conductive lines, dielectric layers, passivation layers, and interconnects, which are not shown for simplicity.

Referring to FIGS. 1 and 2, semiconductor device 100 can further include shallow trench isolation (STI) regions 106, fin structures 108, gate structures 110, fin sidewall spacers 118F, gate spacers 118G, etch stop layer (ESL) 126, and interlayer dielectric (ILD) layer 136.

FinFETs 104A and 104B can be formed on a substrate 102. Substrate 102 can include a semiconductor material, such as silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

STI regions 106 can be configured to provide electrical isolation between finFETs 104A and 104B from each other and from neighboring finFETs with different fin structures (not shown) on substrate 102 and/or neighboring active and passive elements (not shown) integrated with or deposited on substrate 102. In some embodiments, STI regions 106 can include low thermal budget dielectrics. In some embodiments, the low thermal budget dielectrics can be formed by a deposition of a flowable isolation material and a microwave plasma treatment of the flowable isolation material with oxygen radicals at a low temperature from about 200° C. to about 500° C. In some embodiments, the flowable isolation material can include flowable silicon oxide, flowable silicon nitride, flowable silicon oxynitride, flowable silicon carbide, flowable silicon oxycarbide, and other suitable materials. In some embodiments, the flowable isolation material can be deposited by FCVD or other suitable deposition methods.

In some embodiments, STI regions 106 can include silicon oxide, silicon nitride, silicon oxynitride, a low-k dielectric material, and/or other suitable low thermal budget dielectric materials. In some embodiments, STI regions 106 can include a multi-layered structure. In some embodiments, STI regions 106 can have a vertical dimension (e.g., height) 106$h$ along a Z-axis ranging from about 40 nm to about 60 nm. In some embodiments, STI regions 106 between fin structures 108 can have a horizontal dimension (e.g., width) 106$w$ along a Y-axis ranging from about 20 nm to about 60 nm. A ratio of vertical dimension 106$h$ to horizontal dimension 106$w$ can range from about 1 to about 5. Based on the disclosure herein, other low thermal budget dielectrics, dimensions, flowable deposition methods, and plasma treatments for STI regions 106 are within the scope and spirit of this disclosure.

Fin structures 108 can extend along an X-axis and through gate structures 110. Fin structures 108 can include fin base regions 112 and epitaxial fin regions 114 disposed on fin base regions 112. Portions of fin base regions 112 extending above STI regions 106 can be wrapped around by gate structures 110 (not shown). In some embodiments, fin base regions 112 can include material similar to substrate 102. In some embodiments, fin base regions 112 can be formed from a photolithographic patterning and an etching of substrate 102. Based on the disclosure herein, other materials and formation processes for fin base regions 112 are within the scope and spirit of this disclosure.

In some embodiments, epitaxial fin regions 114 can be grown on portions of fin base regions 112 that do not underlie gate structures 110, as illustrated in FIG. 1. In some embodiments, epitaxial fin regions 114 can include multiple epitaxial fin sub-regions having different doping and/or different material composition. In some embodiments, epitaxial fin regions 114 can have any geometric shape, such as a polygon, an ellipsis, and a circle. In some embodiments, epitaxial fin regions 114 on different fin base regions 112 can merge with adjacent epitaxial fin regions, as shown in FIG. 1. In some embodiments, epitaxial fin regions 114 can be unmerged (not shown) from adjacent epitaxial fin regions on separate fin base regions 112.

Epitaxial fin regions 114 can include an epitaxially-grown semiconductor material. In some embodiments, the epitaxially grown semiconductor material is the same material as the material of substrate 102. In some embodiments, the epitaxially-grown semiconductor material can include a different material from the material of substrate 102. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. In some embodiments, n-type epitaxial fin regions 114 can include Si and can be in-situ doped during an epitaxial growth process using n-type dopants, such as phosphorus and arsenic. In some embodiments, p-type epitaxial fin regions 114 can include SiGe and can be in-situ doped during an epitaxial growth process using p-type dopants, such as boron, indium, and gallium.

Referring to FIGS. 1 and 2, fin structures 108 can be current-carrying structures for respective finFETs 104A and 104B. Epitaxial fin regions 114 can be configured to function as source/drain (S/D) regions of respective finFETs 104A and 104B. Channel regions (not shown) of finFETs 104A and 104B can be formed in portions of their respective fin base regions 112 underlying gate structures 110.

Gate structures 110 can include a gate dielectric layer 124 and a gate electrode 128. Additionally, in some embodiments, an interfacial dielectric layer (not shown) can be formed between gate structures 110 and fin base regions 112. In some embodiments, gate dielectric layer 124 is adjacent to and in contact with gate electrode 128. Gate dielectric layer 124 can include silicon oxide. In some embodiments, gate dielectric layer 124 can include (i) a layer of silicon oxide, silicon nitride, and/or silicon oxynitride, (ii) a high-k dielectric material, such as hafnium oxide ($HfO_2$) and titanium oxide ($TiO_2$), (iii) a high-k dielectric material having oxides of lithium (Li), beryllium (Be), or (iv) a combination thereof. In some embodiments, gate dielectric layer 124 can include a single layer or a stack of insulating material layers.

Gate electrode 128 can include a gate barrier layer, a gate work function metal layer and a gate metal fill layer (not shown). In some embodiments, the gate barrier layer is disposed on gate dielectric layer 124. Gate barrier layers can serve as nucleation layers for subsequent formation of gate work function layers and/or can help to reduce or prevent substantial diffusion of metals (e.g., Al) from gate work function layers to underlying layers (e.g. gate dielectric layer 124). Gate barrier layers can include titanium (Ti), tantalum (Ta), titanium nitride (TiN), tantalum nitride (TaN), or other suitable diffusion barrier materials. In some embodiments, the gate work function metal layer can include a single metal layer or a stack of metal layers. The stack of metal layers can include metals having work functions similar to or different from each other. In some embodiments, the gate work function metal layer can include, such as aluminum (Al), copper (Cu), tungsten (W), metal alloys, and combinations thereof. The gate metal fill layer can include a single metal layer or a stack of metal layers. The stack of metal layers can include metals different from each other. In some embodiments, the gate metal fill layer can include a suitable conductive material, such as Ti, silver (Ag), metal alloys, and combinations thereof.

Fin sidewall spacers 118F can be disposed on sidewalls of fin structures 108 and can be in contact with STI regions 106. In some embodiments, fin sidewall spacers 118F can affect the growth profile of epitaxial fin regions 114. Gate spacers 118G can be disposed on sidewalls of gate structures 110 and can be in contact with gate dielectric layer 124. Fin sidewall spacers 118F and gate spacers 118G can each include insulating materials, such as silicon oxide, silicon nitride, a low-k material, and a combination thereof. Fin sidewall spacers 118F and gate spacers 118G can include a low-k material with a dielectric constant less than about 3.9.

ESL 126 can be disposed on epitaxial fin regions 114, STI regions 106, and sides of gate spacers 118G. In some embodiments, ESL 126 can include silicon nitride ($SiN_x$), silicon oxide ($SiO_x$), silicon oxynitride (SiON), silicon carbide (SiC), silicon carbo-nitride (SiCN), and a combination thereof. In some embodiments, ESL 126 can have a thickness in a range from about 1 nm to about 10 nm. ESL 126 can be configured to protect gate structures 110 and/or portions of epitaxial fin regions 114 that are not in contact with S/D contact structures 132. This protection by ESL 126 can be provided, for example, during formation of ILD layer 136 and/or S/D contact structures 132. In some embodiments, ESL 126 can protect epitaxial fin regions 114 from oxidation during formation of ILD layer 136.

ILD layer 136 can be disposed on ESL 126 and can include low thermal budget dielectrics similar to STI regions 106. The low thermal budget dielectrics can be formed by a deposition of flowable dielectric materials, followed by a microwave plasma treatment of the flowable dielectric materials with oxygen radicals at a low temperature from about 200° C. to about 500° C. In some embodiments, the flowable dielectric materials can include flowable silicon oxide, flowable silicon nitride, flowable silicon oxynitride, flowable silicon carbide, flowable silicon oxycarbide, and other suitable materials. In some embodiments, the flowable dielectric materials can be deposited by FCVD or other suitable deposition methods. In some embodiments, the flowable dielectric materials can fill openings having a high aspect ratio (e.g., greater than about 5) with a flowable deposition method. For example, as shown in FIG. 2, ILD layer 136 between epitaxial fin regions 114 can have a vertical dimension 136$h$ (e.g., height) along a Z-axis ranging from about 100 nm to about 200 nm, and a horizontal dimension 136$w$ (e.g., width) along a Y-axis ranging from about 2 nm to about 10 nm. An aspect ratio of vertical dimension 136$h$ to horizontal dimension 136$w$ can range from about 10 to about 30.

In some embodiments, ILD layer 136 can include silicon oxide, silicon nitride, silicon oxynitride, a low-k dielectric material, and/or other suitable low thermal budget dielectric materials. In some embodiments, with low temperature anneal, less oxygen can diffuse through ESL 126 to underlying epitaxial fin regions 114 during the formation of ILD layer 136. As a result, ESL 126 can improve the protection of underlying epitaxial fin regions 114 from oxidation. In some embodiments, with ILD layer 136 having low thermal budget dielectric materials, the thickness of ESL 126 can be reduced without under layer oxidation. For example, with low thermal budget dielectric materials for ILD layer 136, the thickness of ESL 126 can range from about 1 nm to about 3 nm to reduce device parasitic capacitances and improve process windows of dielectric fill, without oxidation of underlying epitaxial fin regions 114.

Referring to FIG. 1, semiconductor device 100 can further include gate capping structures 134 and S/D contact structures 132, according to some embodiments. Gate capping structures 134 can be disposed on gate structures 110 and can be configured to protect the underlying structures and/or layers during subsequent processing of semiconductor device 100. Gate capping structures 134 can include one or more layers of insulating materials having (i) nitride-based material, such as silicon nitride, silicon oxynitride, and TiN; (ii) carbide-based material, such as silicon carbide, titanium carbide, and other suitable metal carbides; (iii) an elementary semiconductor, such as silicon; (iv) metal oxide-based material; or (v) a combination thereof. In some embodiments, gate capping structures 134 can include a stack of layers of insulating material. The stack of layers can include two or more layers of the insulating material.

S/D contact structures 132 can be configured to electrically connect respective S/D regions (e.g., epitaxial fin regions 114) of finFETs 104A and 104B to other elements of semiconductor device 100 and/or of the integrated circuit. S/D contact structures 132 can be formed within ILD layer 136. According to some embodiments, S/D contact structures 132 can include metal silicide layers and conductive regions disposed on metal silicide layers (not shown). In some embodiments, the metal silicide layers can include metal silicides formed from one or more low work function metals deposited on epitaxial fin regions 114. Examples of work function metal(s) used for forming the metal silicide layers can include Ti), Ta, nickel (Ni) and/or other suitable work function metals. In some embodiments, the conductive regions can include one or more high work function metals, such as ruthenium (Ru), cobalt (Co), Ni, and other suitable work function metals. The work function metal can be deposited on the metal silicide layers.

Figure 3:
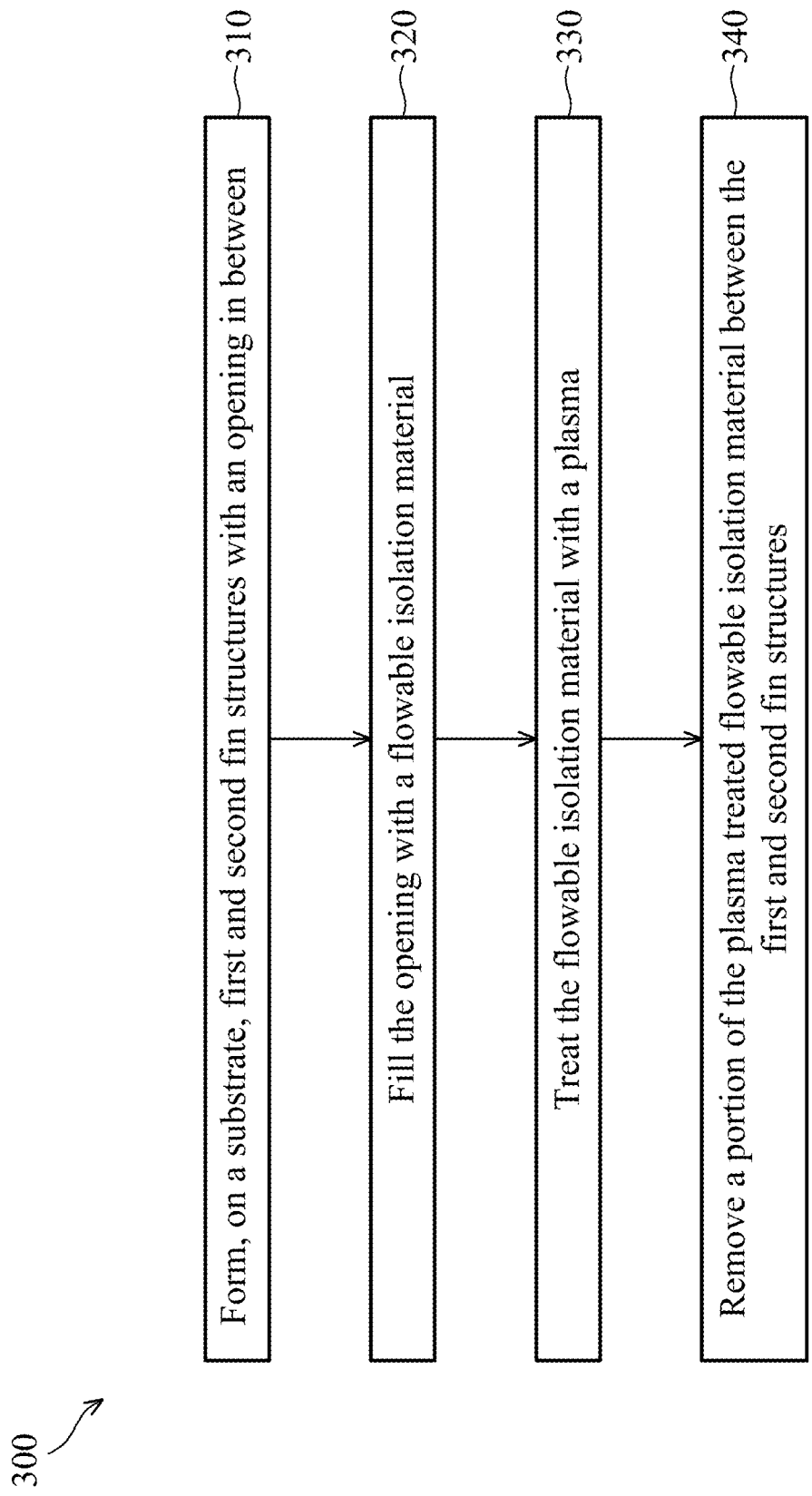
FIG. 3 is a flow diagram of a method for fabricating a semiconductor device with low thermal budget dielectrics, in accordance with some embodiments.

FIG. 3 is a flow diagram of an example method 300 for fabricating semiconductor device 100 with low thermal budget dielectrics, according to some embodiments. Method 300 may not be limited to the formation of STI regions 106, ILD layer 136, and backside ILD layer 1854 having low thermal budget dielectrics and can be applicable to other dielectric deposition and fill processes. Additional fabrication operations may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations.

For illustrative purposes, the operations illustrated in FIG. 3 will be described with reference to the example fabrication process for fabricating semiconductor device 100 as illustrated in FIGS. 4-12 and 18. FIGS. 4-12 and 18 are partial cross-sectional views of semiconductor device 100 along lines B-B and D-D in FIG. 1 at various stages of its fabrication, according to some embodiments. FIGS. 13-17 are profiles along line C-C in FIG. 12 of various elements in semiconductor device 100 having low thermal budget dielectrics, in accordance with some embodiments. Elements in FIGS. 4-12 and 18 with the same annotations as elements in FIGS. 1 and 2 are described above.

Figure 4:
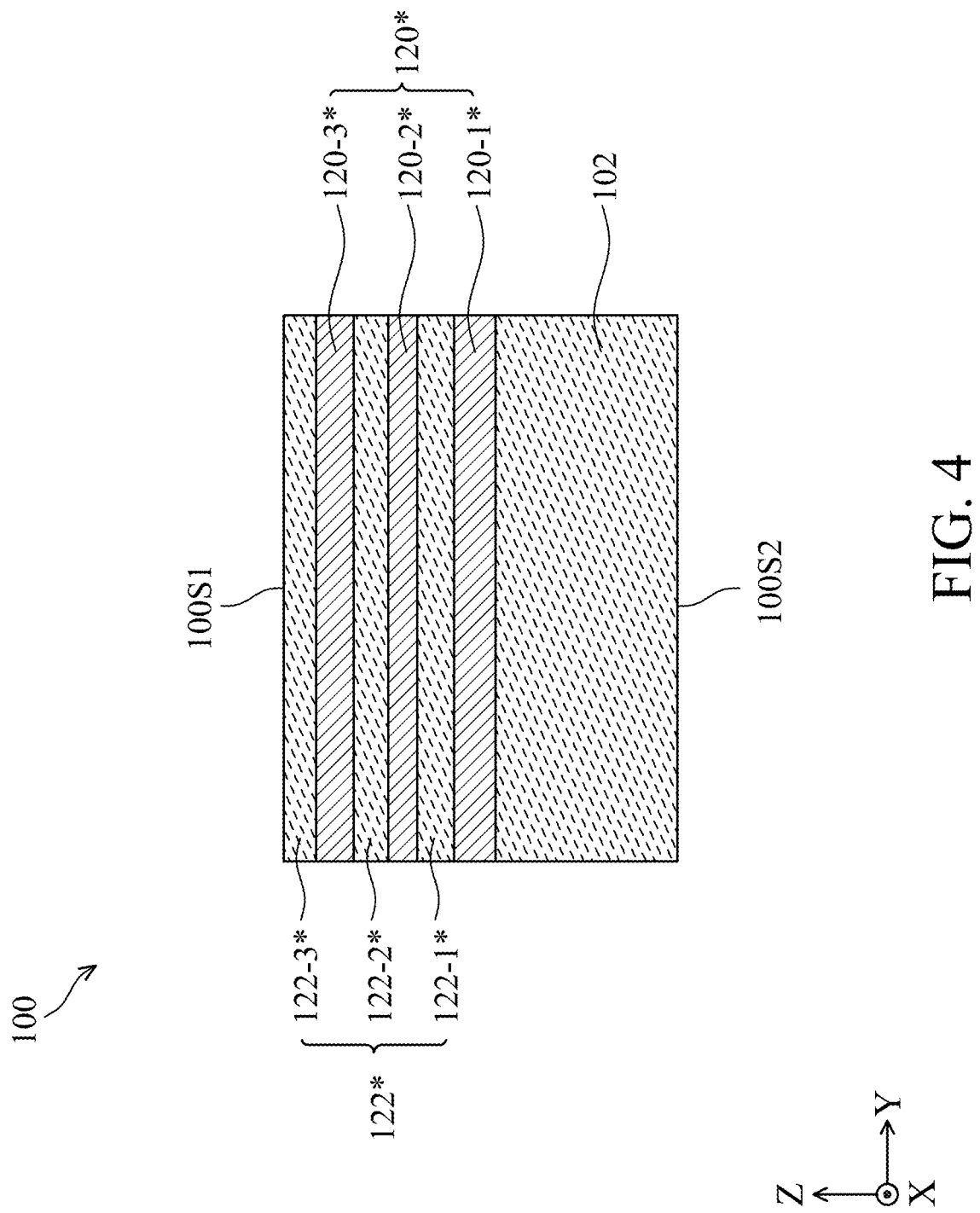
FIGS. 4-12 and 18 are partial cross-sectional views of a semiconductor device having low thermal budget dielectrics at various stages of its fabrication process, in accordance with some embodiments.
Figure 5:
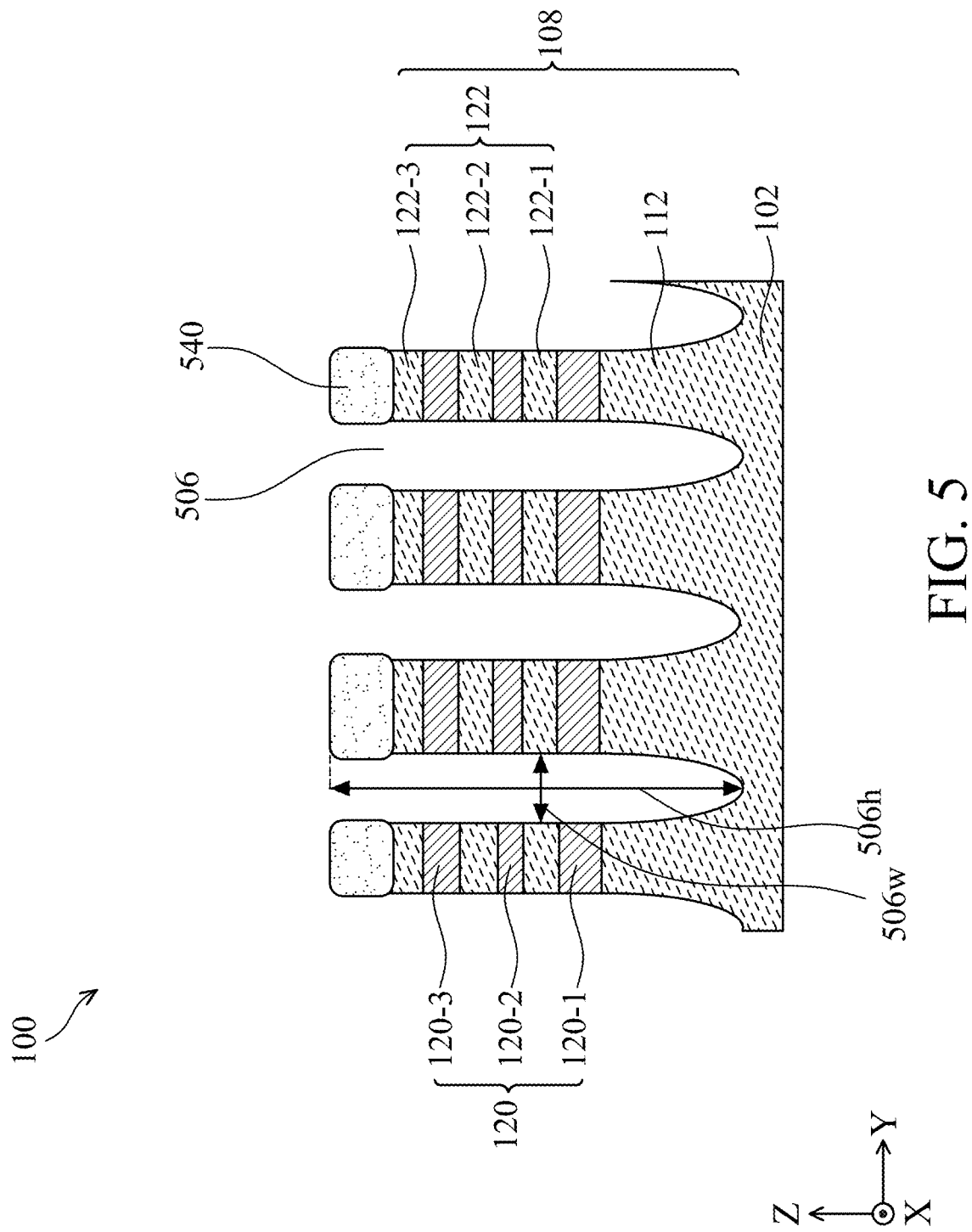

In referring to FIG. 3, method 300 begins with operation 310 and the process of forming on a substrate first and second fin structures with an opening in between. For example, as shown in FIGS. 4 and 5, fin structures 108 with openings 506 can be formed on substrate 102. Fin structures 108 can include fin base regions 112 and first and second semiconductor layers 120 and 122 stacked in an alternating configuration. First semiconductor layers 120 can include first semiconductor sub-layers 120-1, 120-2, and 120-3 (collectively referred to as "first semiconductor layers 120"). Second semiconductor layers 120 can include second semiconductor sub-layers 122-1, 122-2, and 122-3 (collectively referred to as "second semiconductor layers 122"). The formation of fin structures 108 can include epitaxial growth of first and second semiconductor layers 120* and 122* on substrate 102 and subsequent patterning processes to form fin base regions 112 and first and second semiconductor layers 120 and 122.

As illustrated in FIG. 4, each of first and second semiconductor layers 120* and 122* can be epitaxially grown on its underlying layer and can include semiconductor materials different from each other. In some embodiments, first and second semiconductor layers 120* and 122* can include semiconductor materials similar to or different from substrate 102. In some embodiments, first and second semiconductor layers 120* and 122* can include semiconductor materials with oxidation rates and/or etch selectivity different from each other. In some embodiments, second semiconductor layers 122* can include Si without any substantial amount of Ge. First semiconductor layers 120* can include silicon germanium (SiGe) with Ge in a range from about 25 atomic percent to about 50 atomic percent with any remaining atomic percent being Si. Though three layers of semiconductor layers 120 and 122 are shown in FIGS. 4-8, semiconductor device 100 can have any number of semiconductor layers 120 and 122.

As illustrated in FIG. 5, the formation of fin base regions 112 and first and second semiconductor layers 120 and 122 can include etching a portion of substrate 102 and the stack of first and second semiconductor layers 120* and 122* through patterned hard mask layers 540. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

In some embodiments, hard mask layers 540 can be a thin film including silicon oxide or silicon nitride. The etching of the stack of first and second semiconductor layers 120* and 122* can include a dry etch, a wet etch process, or a combination thereof. Openings 506 can be formed between fin structures 108 after the etching process. In some embodiments, openings 506 can have a vertical dimension 506h (e.g., height) along a Z-axis ranging from about 100 nm to about 1000 nm. In some embodiments, openings 506 can have a horizontal dimension 506w (e.g., width) along a Y-axis ranging from about 15 nm to about 75 nm. A ratio of vertical dimension 506h to horizontal dimension 506w can range from about 8 to 15.

Figure 6:
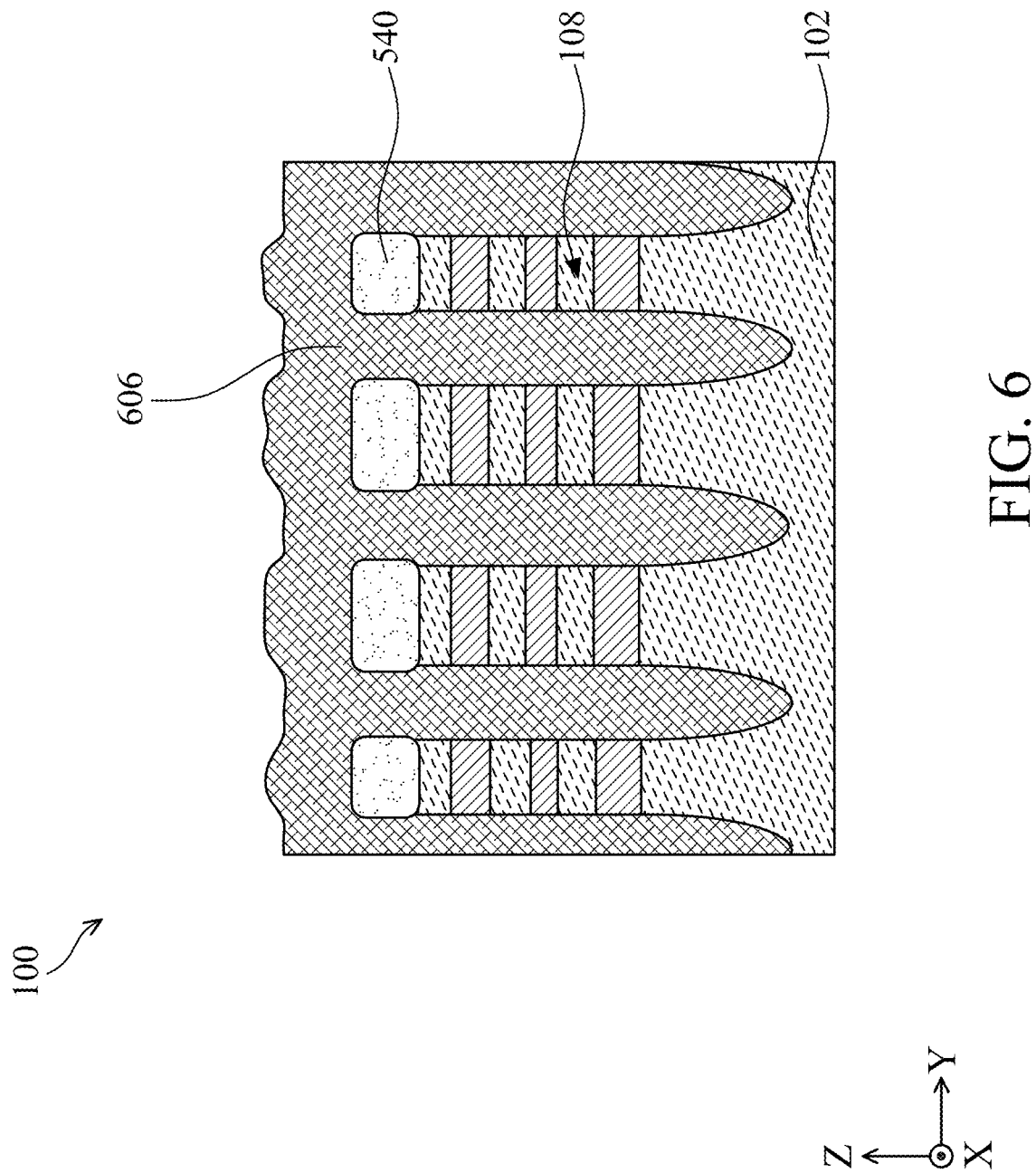

Referring to FIG. 3, in operation 320, the opening can be filled with a flowable isolation material. For example, as shown in FIG. 6, openings 506 can be filled with a flowable isolation material 606. In some embodiments, flowable isolation material 606 can include flowable silicon oxide, flowable silicon nitride, flowable silicon oxynitride, flowable silicon carbide, flowable silicon oxycarbide, and other suitable materials. In some embodiments, flowable isolation material 606 can be deposited by FCVD or other suitable deposition methods. For example, flowable isolation material 606 can include flowable silicon oxide deposited by FCVD using silane ($SiH_4$) and oxygen ($O_2$) as reacting precursors. In some embodiments, openings 506 can be filled with flowable isolation material 606 by FCVD to ensure that openings 506 between fin structures 108 are filled without forming voids and seams.

In some embodiments, to improve its dielectric and structural properties, flowable isolation material 606 can be subjected to a high temperature wet steam anneal (e.g., 100% water molecules) at a temperature between about 600° C. and about 1200° C. for about 1 hour to about 4 hours. During the wet steam anneal, flowable isolation material 606 can be densified and form STI regions 106. In some embodiments, STI regions 106 can have higher oxygen content than flowable isolation material 606 after the wet steam anneal. STI regions 106 can provide electrical isolation to fin structures 108 from neighboring active and passive elements (not shown) integrated with or deposited onto substrate 102. In some embodiments, flowable isolation material 606 can be densified without a high temperature anneal.

Figure 7:
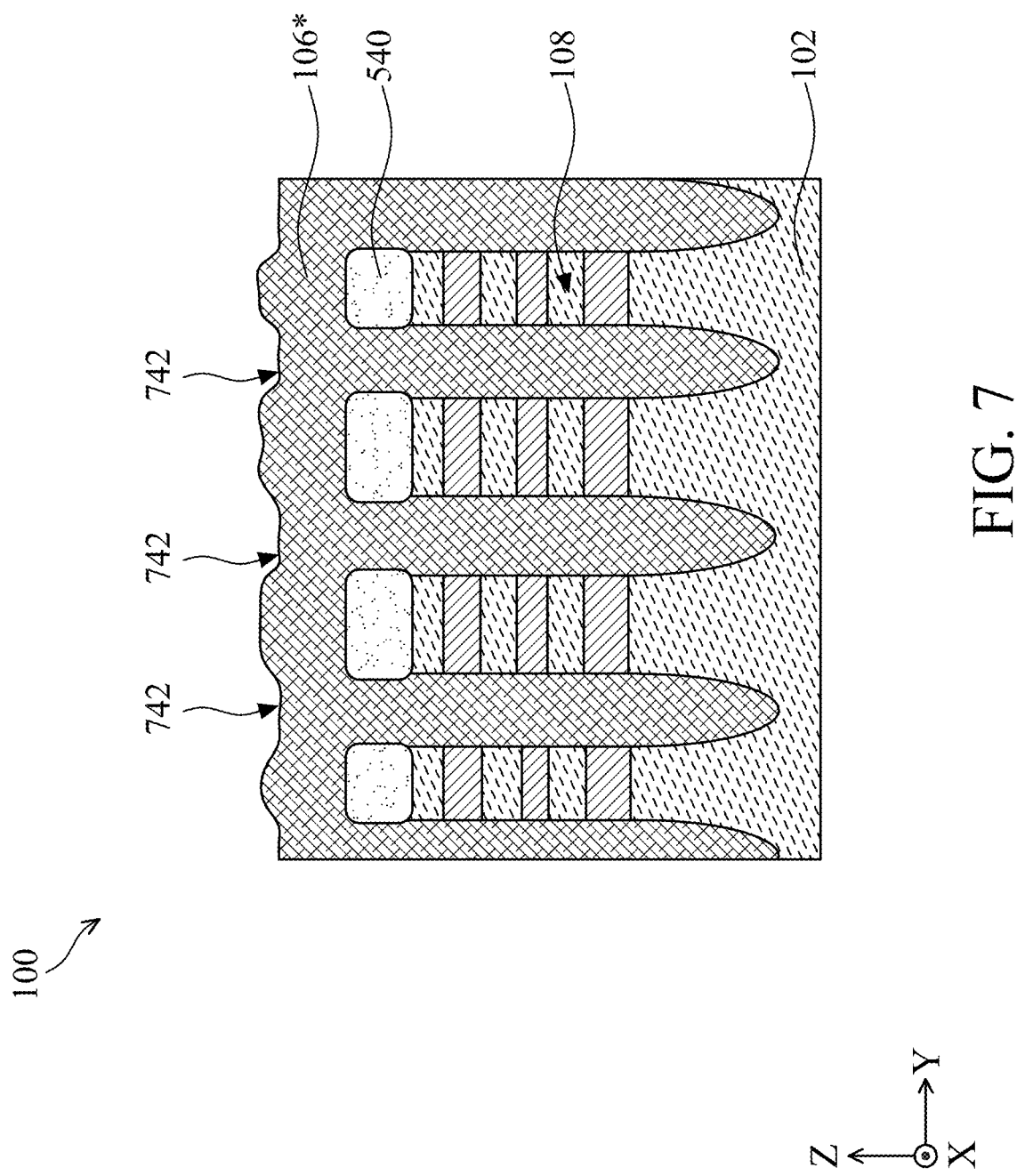

Referring to FIG. 3, in operation 330, the flowable isolation material can be treated with a plasma. For example, as shown in FIG. 7, flowable isolation material 606 can be treated with a plasma 742 to densify and form STI regions 106*. In some embodiments, plasma 742 can include oxygen radicals. In some embodiments, plasma 742 can include oxygen radicals and hydrogen radicals. A ratio of the oxygen radicals to the hydrogen radicals can range from about 95:5 to about 99:1 to improve densification of flowable isolation material 606 and increase an oxidation rate of plasma 742. If the ratio is less than about 95:5, the oxidation rate of plasma 742 may be increased too much to control the treatment time and plasma 742 may cause under layer oxidation. If the ratio is greater than about 99:1, the oxidation rate of plasma 742 may not be increased and the densification of flowable isolation material 606 may not be improved.

In some embodiments, a low temperature microwave plasma treatment can generate plasma 742 and treat flowable isolation material 606 to form STI regions 106*. In some embodiments, the plasma of the low temperature microwave plasma treatment can be generated by a generation source, such as a magnetron or a microwave oven. The generated plasma can be introduced to semiconductor device 100 through a wave guide. In some embodiments, a frequency of the microwave used to generate the plasma is about 2.45 GHz. Compared to other plasmas, microwave plasma can have more radicals than ions. These radicals can have longer life time and thereby can produce deeper penetration and more conformal coverage. In addition, microwave plasma can have less plasma damage compared to other plasmas. The low temperature microwave plasma treatment can be performed at a temperature from about 200° C. to about 500° C. under a pressure from about 0.5 torr to about 5 torr for about 2 min to about 10 min. A power level of the low temperature microwave plasma treatment can range from about 500 W to about 3000 W. If the temperature is greater than about 500° C., the pressure is greater than about 5 torr, or the power level is greater than about 3000 W, the microwave plasma treatment may have a faster oxidation rate and the treatment time may be too short to control. In addition, plasma 742 may cause under layer oxidation if the treatment time is greater than about 10 min. If the temperature is less than about 200° C., the pressure is less than about 0.5 torr, the treatment time is less than about 2 min, or the power level is greater than about 500 W, the microwave plasma treatment may not effectively densify flowable isolation material 606 to form STI regions 106*. In some embodiments, the temperature of the microwave plasma treatment can range from about 400° C. to about 500° C. to further improve densification of flowable isolation material 606. In some embodiments, compared to the high temperature steam anneal, the low temperature microwave plasma treatment can reduce the treatment temperature and treatment time, thus reducing thermal budget, improving working capacity (e.g., wafers per hour), and reducing manufacturing cost. In some embodiments, compared to the high temperature steam anneal, the low temperature microwave plasma treatment can increase the density of STI regions 106* by about 10% to about 40%, for example, from about 1.8 $g/cm^{-3}$ to about 2.4 $g/cm^{-3}$.

In some embodiments, the microwave plasma treatment can generate plasma 742 from a mixture of oxygen, hydrogen, and an inert gas (e.g., argon or helium). A flow rate of oxygen gas can range from about 5 standard cubic centimeters per minute (sccm) to about 100 sccm. A flow rate of hydrogen gas can range from about 1 sccm to about 10 sccm. A flow rate of the inert gas can range from about 900 sccm to about 1000 sccm. A ratio of the flow rate of oxygen gas to hydrogen gas can range from about 95:5 to about 99:1 to generate plasma 742 having appropriate ratios of oxygen radicals and hydrogen radicals to improve densification of flowable isolation material 606 and increase the oxidation rate of plasma 742. In some embodiments, the microwave plasma treatment can generate plasma 742 from a mixture of ozone, hydrogen, and an inert gas. Due to stronger oxidation ability of ozone compared to oxygen, microwave plasma generated from ozone can lower the temperature of the microwave plasma treatment by about 10% to about 20%. In some embodiments, the low temperature plasma treatment using ozone can be performed at a temperature from about 275° C. to about 350° C. Compared to oxygen, a flow rate of ozone can be reduced by about 10% to about 30%. In some embodiments, exposed areas of adjacent structures around flowable isolation material 606 may be oxidized during low temperature microwave plasma treatment using ozone plasma.

In some embodiments, the microwave plasma treatment can generate plasma 742 having a high radical density from about $10^{10}$ cm$^{-3}$ to about $10^{15}$ cm$^{-3}$ for deeper penetration. If plasma 742 has a radical density less than about $10^{10}$ cm$^{-3}$, plasma 742 may have a lower oxidation rate and the microwave plasma treatment may take longer time. If plasma 742 has a radical density greater than about $10^{15}$ cm$^{-3}$, plasma 742 may have an oxidation rate too fast to control the treatment time and plasma 742 may cause under layer oxidation.

In some embodiments, the low temperature microwave plasma treatment using plasma 742 can reduce Si and SiGe intermixing between first semiconductor layers 120 and second semiconductor layers 122 due to a lower treatment temperature (e.g., from about 200° C. to about 500° C.). In some embodiments, the Si and SiGe intermixing can be reduced by about 50% to about 90%. For example, a thickness of the Si and SiGe intermixing layer can be reduced from about 0.8 nm to about 0.2 nm. The reduction of Si and SiGe intermixing can improve an etching rate of first semiconductor layers 120 having SiGe during subsequent processes. In some embodiments, compared to the wet steam anneal at a temperature above about 750° C., the microwave plasma treatment can improve the etching rate of first semiconductor layers 120 by about 1% to about 3%. In some embodiments, compared to the wet steam anneal at a temperature above about 700° C., the microwave plasma treatment can improve the etching rate of first semiconductor layers 120 by about 2% to about 5%. In some embodiments, compared to the wet steam anneal at a temperature above about 600° C., the microwave plasma treatment can improve the etching rate of first semiconductor layers 120 by about 5% to about 12%.

In some embodiments, STI regions 106* formed by the low temperature microwave plasma treatment can have comparable or improved reliability compared to STI regions formed by the high temperature wet steam anneal. In some embodiments, STI regions 106* formed by the low temperature microwave plasma treatment can have comparable reliability compared to STI regions formed by the wet steam anneal at a temperature above about 750° C. In some embodiments, the low temperature microwave plasma treatment can improve the reliability of STI regions 106* by about 2% to about 8% compared to the wet steam anneal at a temperature from about 600° C. to about 750° C.

Figure 8:
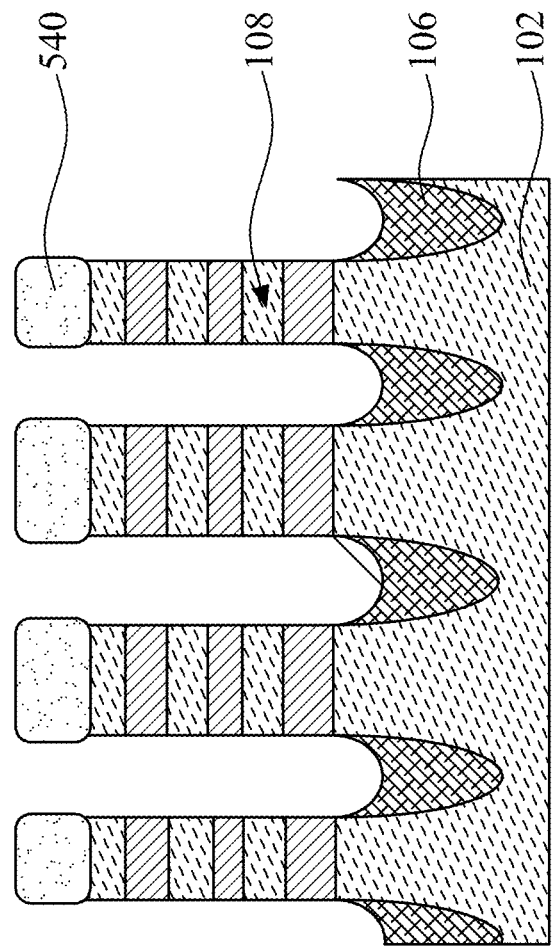

Referring to FIG. 3, in operation 340, a portion of the plasma-treated flowable isolation material between the first and second fin structures can be removed. For example, as shown in FIG. 8, a portion of STI regions 106* between fin structures 108, which are the plasma-treated flowable isolation material 606, can be removed to form STI regions 106. The low temperature microwave plasma treatment can be followed by a chemical mechanical polishing (CMP) process that can remove portions of STI regions 106* above hard mask layers 540 to substantially co-planarize top surfaces of hard mask layers 540 on fin structures 108. The CMP process can be followed by an etching process to etch back STI regions 106* to form STI regions 106 shown in FIG. 8.

The etching process to etch back STI regions 106* can be performed, for example, by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform (CHF$_3$) and He, carbon tetrafluoride (CF$_4$), difluoromethane (CH$_2$F$_2$), chlorine (Cl$_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia (NH$_3$) and hydrofluoric acid (HF) as etchants and inert gases, such as Ar, xenon (Xe), He, and a combination thereof. In some embodiments, the flow rates of HF and NH$_3$ used in the etch process can each range from about 10 sccm to about 100 sccm. In some embodiments, the etch process with ammonia (NH$_3$) and hydrofluoric acid (HF) can be performed under a pressure ranging from about 5 mTorr to about 100 mTorr at a temperature ranging from about 50° C. to about 120° C.

Figure 9:
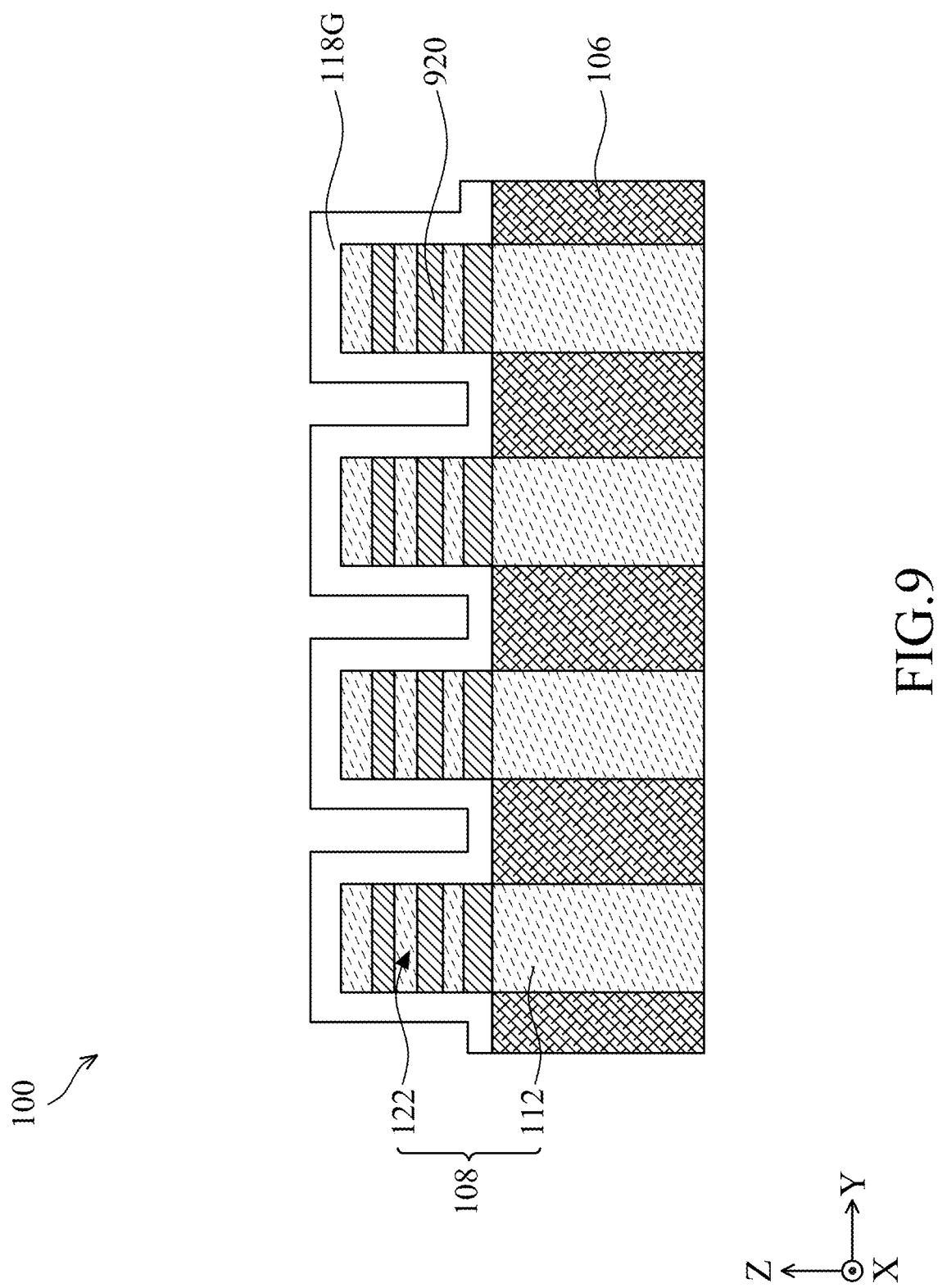

The formation of STI regions 106 can be followed by formation of sacrificial gate structures (not shown), formation of gate spacers 118G and fin sidewall spacers 118F, formation of fin base regions 112, and formation of inner spacer structures 920 shown in FIG. 9, the details of which may be omitted merely for clarity and ease of description. FIG. 9 illustrates a partial cross-sectional view along line B-B shown in FIG. 1 for semiconductor device 100 after the formation of inner spacer structures 920, according to some embodiments. In some embodiments, inner spacer structures 920 can include silicon oxide (SiOx), silicon oxynitride (SiOxN), silicon nitride (SiNx), silicon oxycarbide (SiOC), silicon oxynitride (SiON), silicon carbonitride (SiCN), silicon oxycarbonitride (SiOCN), or other suitable materials deposited by atomic layer deposition (ALD), plasma-enhanced chemical vapor deposition (PECVD), or other suitable deposition methods.

Figure 10:
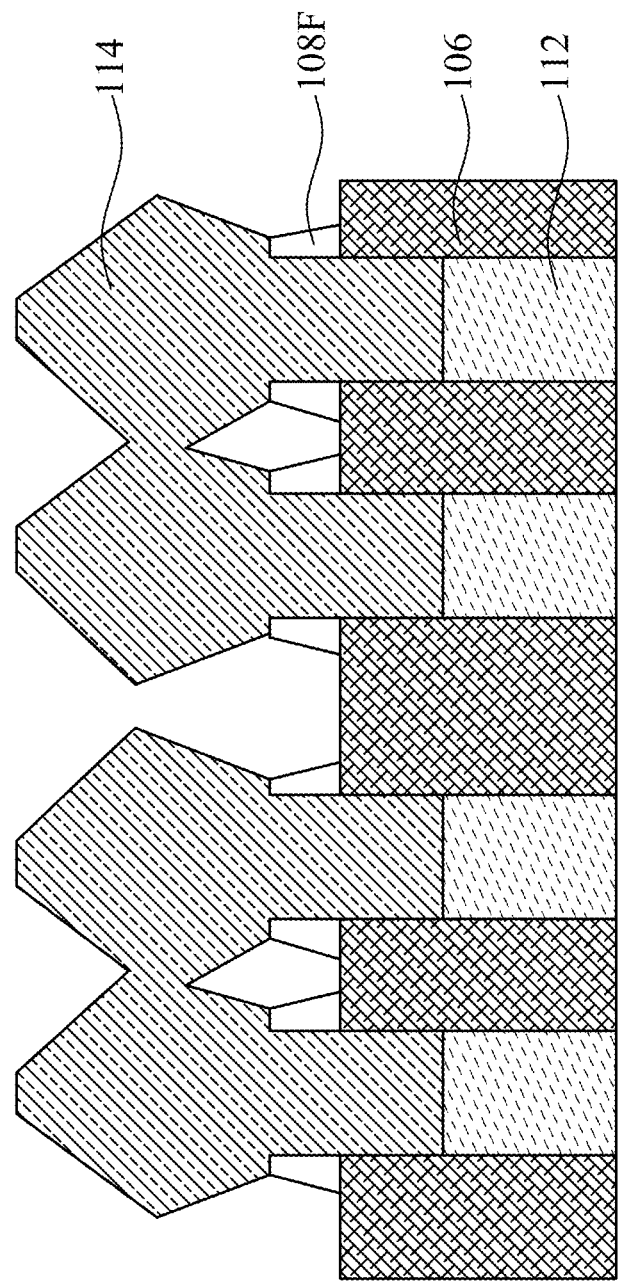

The formation of inner spacer structures 920 can be followed by formation of epitaxial fin regions 114, as shown in FIG. 10. In some embodiments, epitaxial fin regions 114 can be grown by an epitaxial deposition/partial etch process, which repeats the epitaxial deposition/partial etch process at least once. Such repeated deposition/partial etch process is also called a "cyclic deposition-etch (CDE) process." In some embodiments, epitaxial fin regions 114 can be grown by selective epitaxial growth (SEG), where an etching gas is added to promote the selective growth of semiconductor material on the exposed surfaces of fin base regions 112, but not on insulating materials (e.g., dielectric materials of STI regions 106). In some embodiments, epitaxial fin regions 114 can be grown with in-situ doping. In some embodiments, epitaxial fin regions 114 can include multiple epitaxial fin sub-regions. In some embodiments, epitaxial fin regions 114 can have any geometric shape, such as a polygon, an ellipsis, and a circle. In some embodiments, epitaxial fin regions 114 on different fin base regions 112 can merge with adjacent epitaxial fin regions, as shown in FIG. 10. In some embodiments, epitaxial fin regions 114 can be unmerged (not shown) from adjacent epitaxial fin regions on separate fin base regions 112.

Figure 11:
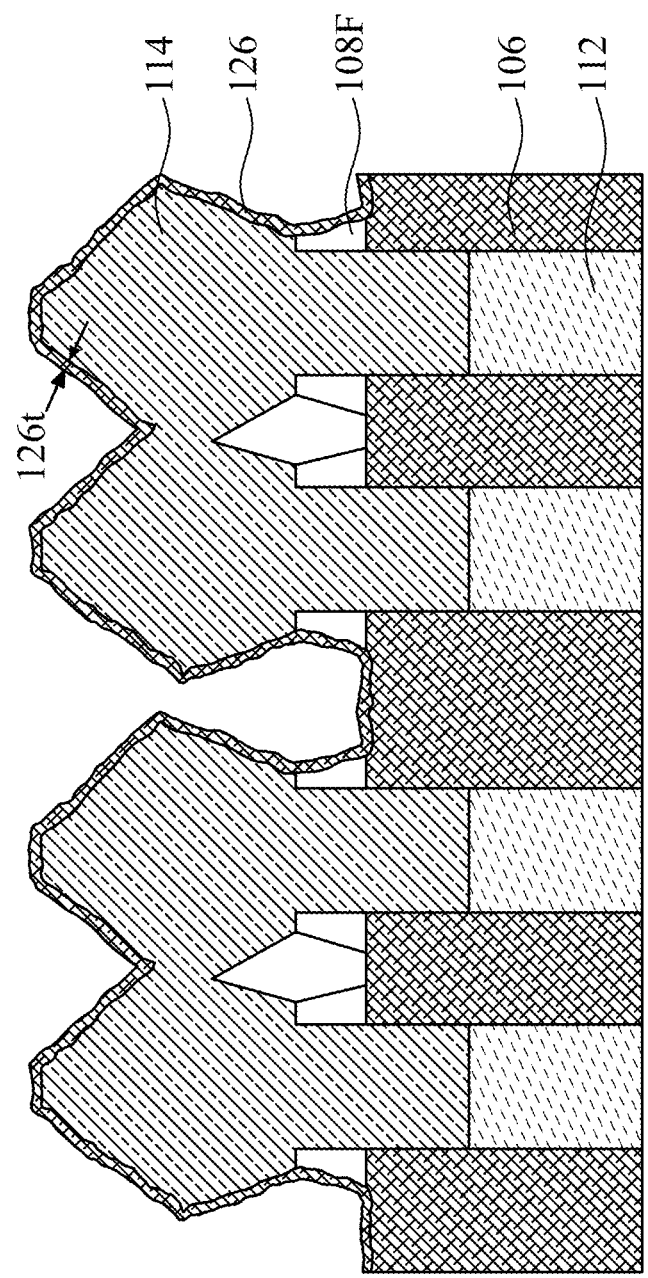

The formation of epitaxial fin regions 114 can be followed by deposition of ESL 126, as shown in FIG. 11. ESL 126 can be blanket deposited on epitaxial fin regions 114, STI regions 106, and sidewalls of gate spacers 118G and fin sidewall spacers 118F. In some embodiments, ESL 126 can include, for example, silicon nitride (SiN$_x$), silicon oxide (SiO$_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 126 can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 126 can have a thickness 126t ranging from about 1 nm to about 30 nm. ESL 126 can be configured to protect epitaxial fin regions 114. This protection can be provided, for example, during formation of ILD layer 136 (shown in FIG. 12) and/or S/D contact structures 132 (shown in FIG. 1).

Figure 12:
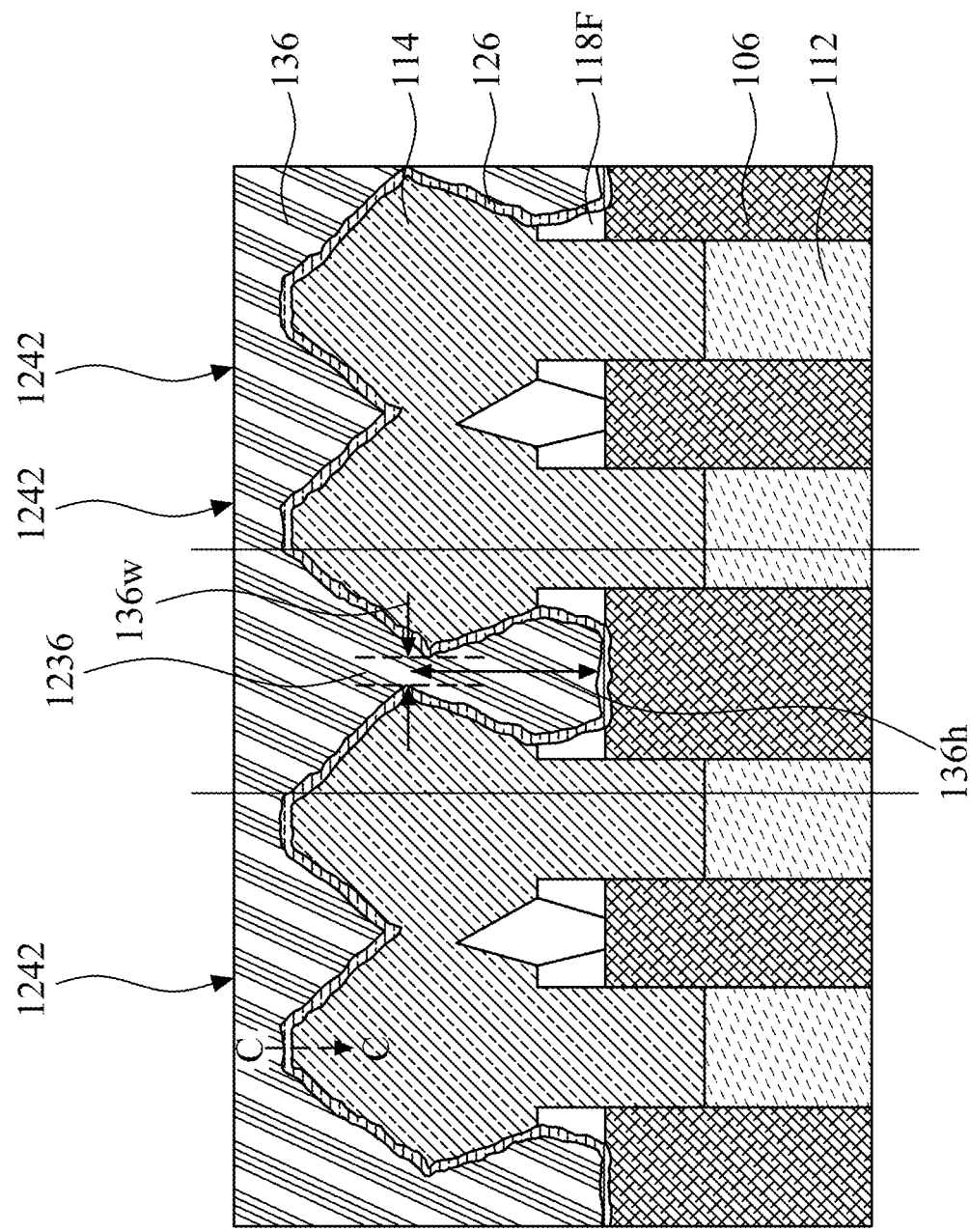

The deposition of ESL 126 can be followed by formation of ILD layer 136, as shown in FIG. 12. The formation of ILD layer 136 can include a deposition of flowable dielectric materials and a low temperature microwave plasma treatment of the flowable dielectric materials. In some embodiments, the flowable dielectric materials can be the same as flowable isolation material 606. In some embodiments, the flowable dielectric materials can include flowable silicon oxide, flowable silicon nitride, flowable silicon oxynitride, flowable silicon carbide, flowable silicon oxycarbide, and other suitable materials. In some embodiments the flowable dielectric materials can be deposited by FCVD or other suitable deposition methods. For example, the flowable dielectric materials can include flowable silicon oxide deposited by FCVD using silane ($SiH_4$) and oxygen ($O_2$) as reacting precursors.

In some embodiments, flowable dielectric materials can fill openings 1236 between adjacent epitaxial fin regions 114 without voids and seams. In some embodiments, openings 1236 can have a vertical dimension 136h (e.g., height) along a Z-axis ranging from about 100 nm to about 200 nm, and a horizontal dimension 136w (e.g., width) along a Y-axis ranging from about 2 nm to about 10 nm. An aspect ratio of vertical dimension 136h to horizontal dimension 136w can range from about 10 to about 30. In some embodiments, flowable dielectric materials can fill openings around epitaxial fin regions 114 and have a diameter from about 15 nm to about 25 nm with an aspect ratio from about 2 to about 5.

The deposition of flowable dielectric materials can be followed by a low temperature microwave plasma treatment using a plasma 1242, as shown in FIG. 12. In some embodiments, plasma 1242 can include radicals the same as or similar to plasma 742. In some embodiments, plasma 1242 can include oxygen radicals. In some embodiments, plasma 1242 can include oxygen radicals and hydrogen radicals. A ratio of the oxygen radicals to the hydrogen radicals can range from about 95:5 to about 99:1 to improve densification of the flowable dielectric materials and increase an oxidation rate of plasma 1242. If the ratio is less than about 95:5, the oxidation rate of plasma 1242 may be increased too much to control the treatment time and plasma 1242 may cause under layer oxidation of epitaxial fin regions 114. If the ratio is greater than about 99:1, the oxidation rate of plasma 1242 may not be increased and the densification of the flowable dielectric materials may not be improved.

The low temperature microwave plasma treatment can be the same as or similar to the microwave plasma treatment treating flowable isolation material 606. In some embodiments, the low temperature microwave plasma treatment can be performed at a temperature from about 200° C. to about 400° C. under a pressure from about 0.5 torr to about 5 torr for about 2 min to about 10 min. A power level of the low temperature microwave plasma treatment can range from about 500 W to about 3000 W. If the temperature is greater than about 400° C., the pressure is greater than about 5 torr, or the power level is greater than about 3000 W, the microwave plasma treatment may have a faster oxidation rate and the treatment time may be too short to control. In addition, plasma 1242 may cause under layer oxidation of epitaxial fin regions 114 if the treatment time is greater than about 10 min. If the temperature is less than about 200° C., the pressure is less than about 0.5 torr, the treatment time is less than about 2 min, or the power level is greater than about 500 W, the microwave plasma treatment may not effectively densify the flowable dielectric materials. In some embodiments, the temperature of the microwave plasma treatment on the flowable dielectric materials can range from about 300° C. to about 400° C. to further improve densification of the flowable dielectric materials for ILD layer 136.

In some embodiments, the low temperature microwave plasma treatment can generate plasma 1242 from a mixture of oxygen, hydrogen, and an inert gas (e.g., argon or helium) in a way the same as or similar to the way to generate plasma 742. In some embodiments, the microwave plasma treatment can generate plasma 1242 having a high radical density from about $10^{10}$ cm$^{-3}$ to about $10^{15}$ cm$^{-3}$ for deeper penetration. In some embodiments, ILD layer 136 formed by the low temperature microwave plasma treatment can have comparable or improved reliability compared to ILD layer 136 formed by the high temperature wet steam anneal.

In some embodiments, the microwave plasma treatment can treat ILD layer 136 at a lower temperature than the wet steam anneal to reduce under layer oxidation of epitaxial fin regions 114. As a result, the thickness of ESL 126 can be reduced to about 1 nm to about 3 nm without under layer oxidation of epitaxial fin regions 114 during formation of ILD layer 136. FIGS. 13-17 illustrate profiles along line C-C in FIG. 12 of various elements in semiconductor device 100 having low thermal budget dielectrics, in accordance with some embodiments. In some embodiments, profiles 1344, 1444, 1544, 1644, and 1744 can represent a distribution of germanium along line C-C in FIG. 12. The region having germanium in FIGS. 13-17 can represent epitaxial fin regions 114 having SiGe. In some embodiments, profiles 1346, 1446, 1546, 1646, and 1746 can represent a distribution of nitrogen along line C-C in FIG. 12. The region having nitrogen in FIGS. 13-17 can represent ESL 126 having silicon nitride. In some embodiments, profiles 1347, 1447, 1547, 1647, and 1747 can represent a distribution of silicon along line C-C in FIG. 12. In some embodiments, profiles 1348, 1448, 1548, 1648, and 1748 can represent a distribution of oxygen along line C-C in FIG. 12. The region having oxygen in FIGS. 13-17 can represent ILD layer 136 having silicon oxide.

Figure 13:
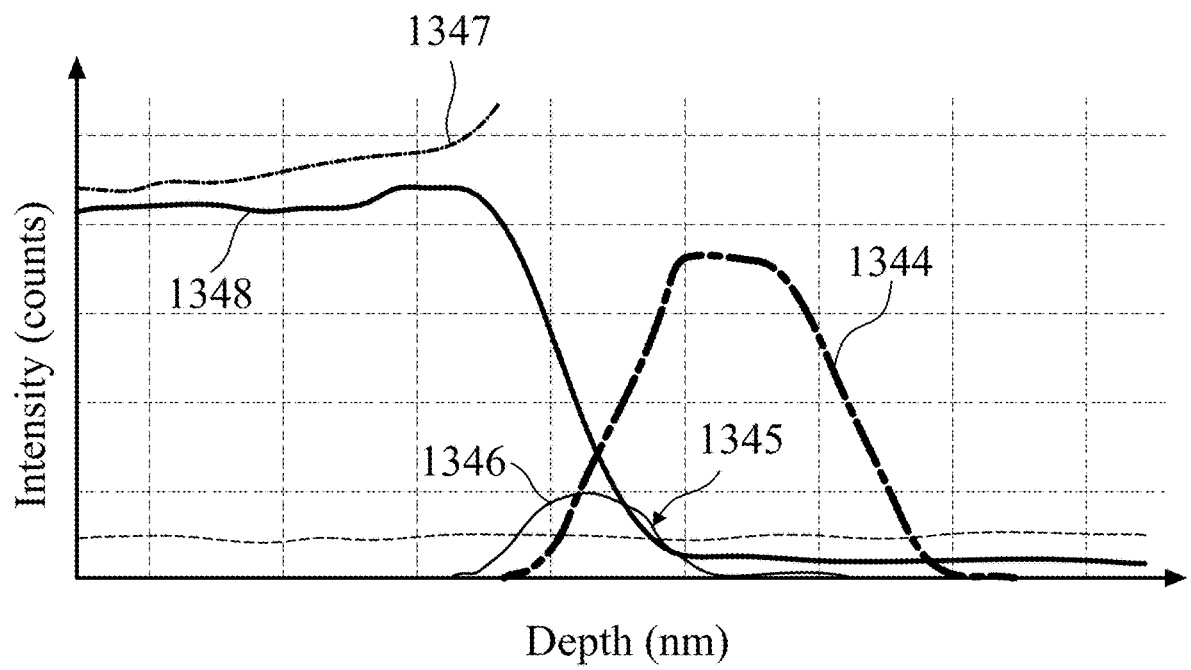
FIGS. 13-17 are profiles of various elements in a semiconductor device having low thermal budget dielectrics, in accordance with some embodiments.
Figure 14:
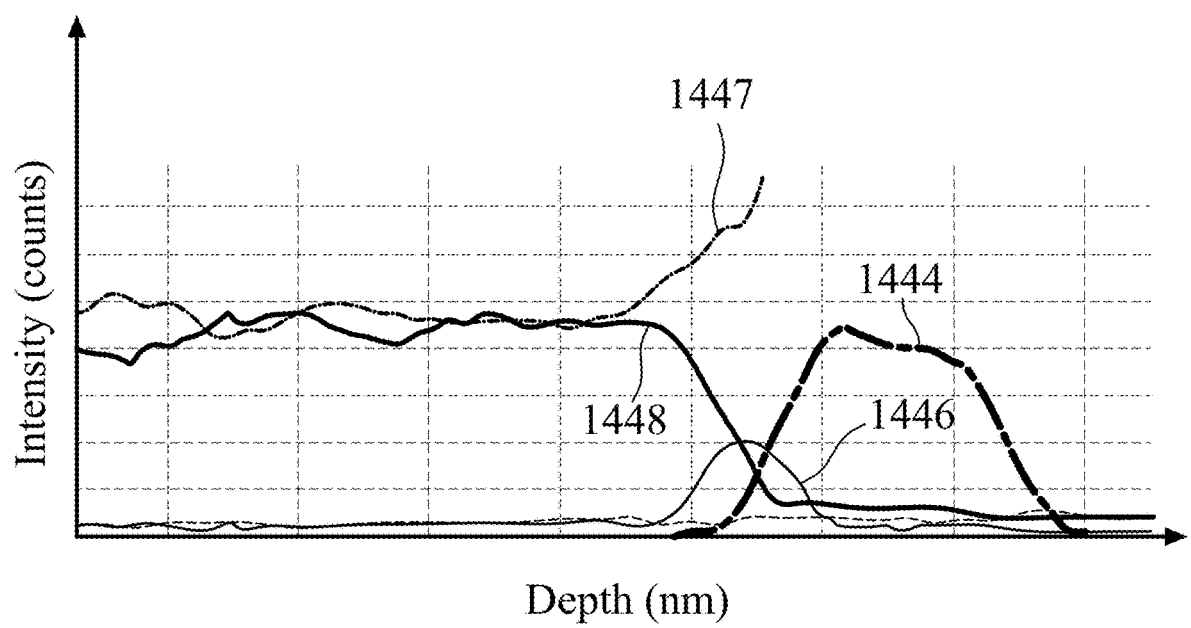
Figure 15:
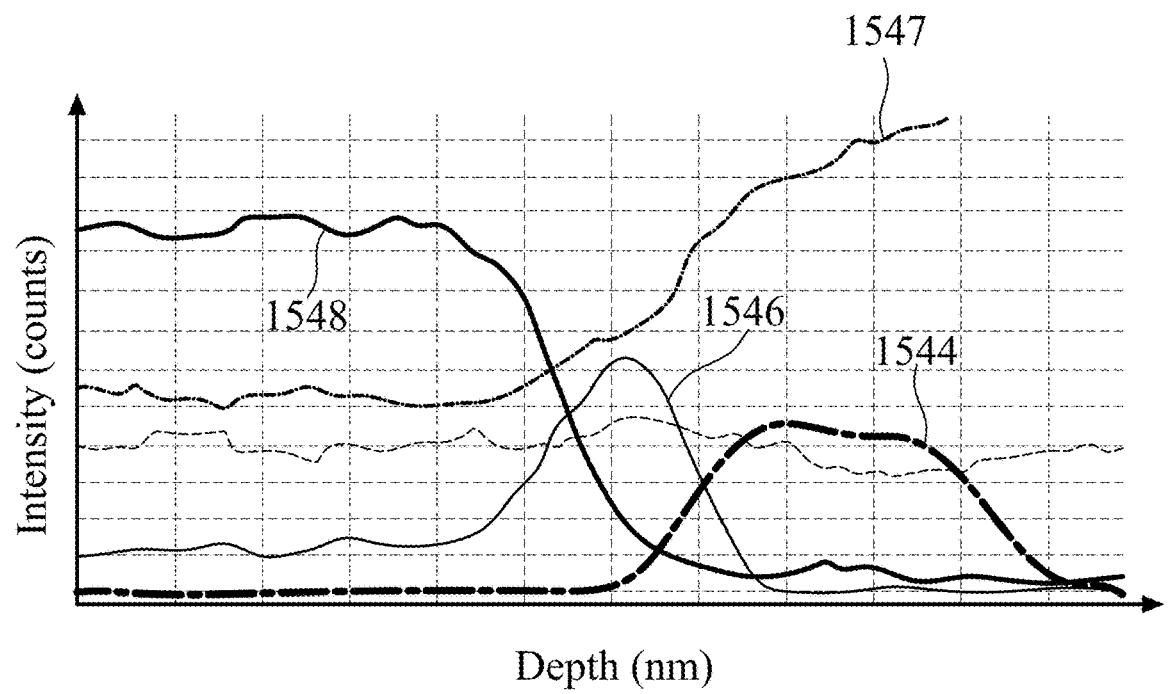
Figure 16:
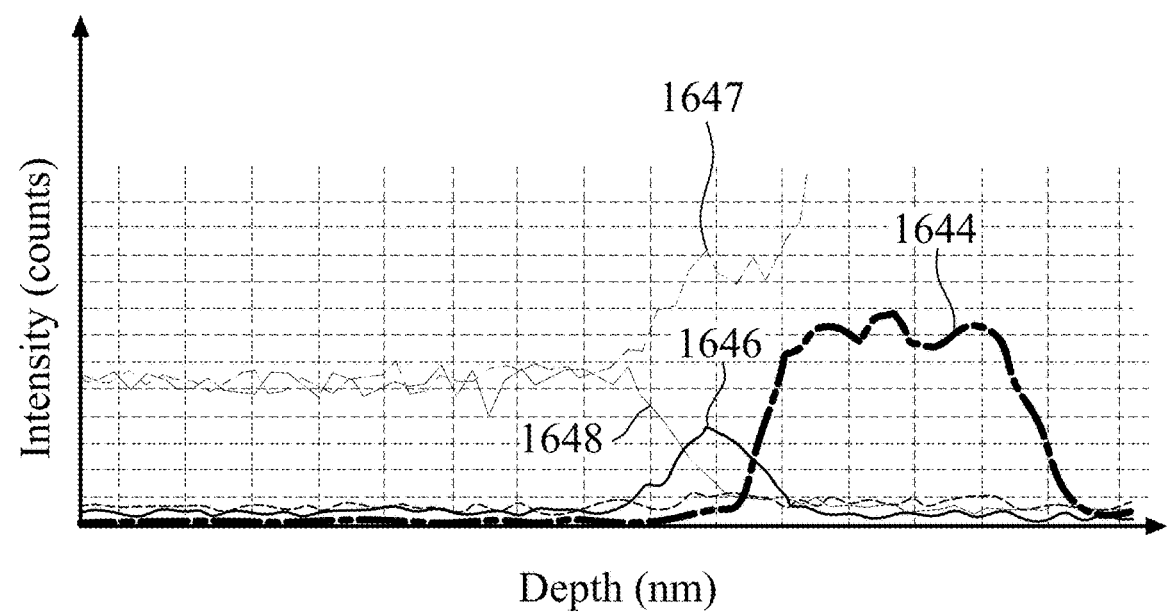
Figure 17:
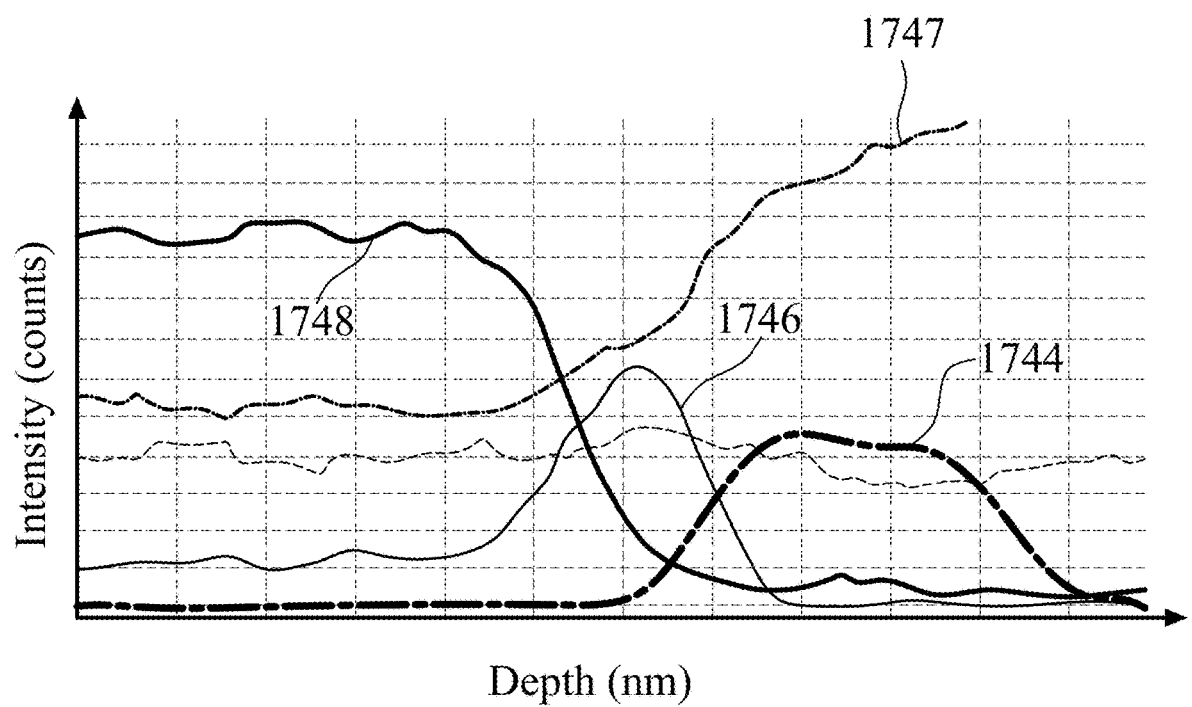

In some embodiments, FIGS. 13,15, and 17 can represent profiles having ILD layer 136 treated under a high temperature anneal (e.g., from about 600° C. to about 1000° C.) and having ESL 126 with a thickness of about 2 nm, about 3 nm, and about 4 nm, respectively. In some embodiments, FIGS. 14 and 16 can represent profiles having ILD layer 136 after a low temperature microwave plasma treatment (e.g., from about 200° C. to about 400° C.) and having ESL 126 with a thickness of about 2 nm to about 3 nm, respectively.

In some embodiments, ILD layer 136 in FIGS. 13, 15, and 17 can include a first layer of silicon oxide having a thickness of about 10 nm to about 15 nm and a second layer of silicon oxide having a thickness of about 30 nm to about 50 nm. The first layer of silicon oxide can be deposited by ALD at a temperature from about 200° C. to about 300° C. The second layer of silicon oxide can be deposited by CVD at a temperature from about 300° C. to about 500° C. The first and second layers of silicon oxide can be annealed under a temperature from about 600° C. to about 1000° C. after deposition. As indicated by arrow 1345 in FIG. 13, oxygen counts are higher in the region of high nitrogen counts and region of high germanium counts, which can indicate oxygen diffusion through ESL 126 having silicon nitride and into epitaxial fin regions 114 having germanium. As a result, after the anneal, oxygen can penetrate ESL 126 with a thickness of about 2 nm and cause oxidation of epitaxial fin regions 114. As shown in FIGS. 15 and 17, there is minimal oxygen in the region having germanium (e.g., epitaxial fin regions 114). As a result, after the anneal, oxygen may not penetrate ESL 126 with a thickness of about 3 nm to 4 nm. Therefore, for ILD layer 136 treated under a high temperature anneal (e.g., from about 600° C. to about 1000° C.), ESL 126 may need to have a thickness equal or greater than about 3 nm to reduce or prevent under layer oxidation. Compared to FIGS. 13, 15, and 17, FIGS. 14 and 16 both show minimal oxygen in the region having germanium (e.g., epitaxial fin regions 114). As a result, after the microwave plasma treatment, oxygen may not penetrate ESL 126 with a thickness of about 2 nm to 3 nm. Therefore, for ILD layer 136 treated with a low temperature (e.g., from about 200° C. to about 400° C.) microwave plasma treatment, ESL 126 can have a thickness less than about 3 nm to reduce or prevent under layer oxidation.

In some embodiments, for ILD layer 136 treated with a low temperature (e.g., from about 200° C. to about 400° C.) microwave plasma treatment, ESL 126 can have a thickness from about 1 nm to about 3 nm to reduce or prevent under layer oxidation (e.g., oxidation of epitaxial fin regions 114 and gate structures 110). In addition, with the thickness of ESL 126 ranging from about 1 nm to about 3 nm, parasitic capacitance of semiconductor device 100 can be reduced, and ILD layer 136 can have fewer voids and seams as a result of wider openings (e.g., greater 136w in FIG. 12). If the thickness is less than about 1 nm, ESL 126 may not reduce or prevent under layer oxidation. If the thickness is greater than about 3 nm, parasitic capacitance may increase and ILD layer 136 may have voids or seams.

Figure 18:
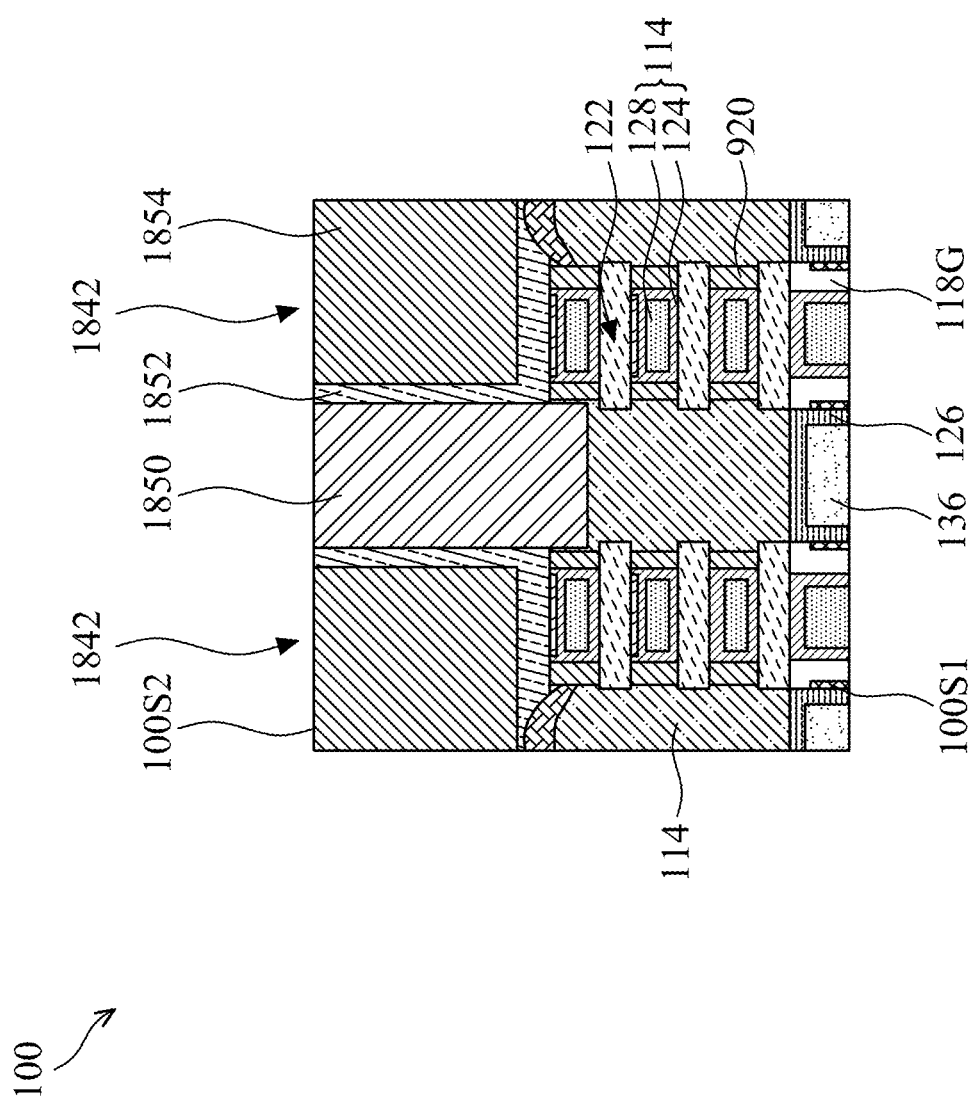

The formation of ILD layer 136 can be followed by formation of gate structures 110, formation of S/D contact structures 132, formation of metal vias and metal lines (not shown) connected to gate structures 110 and S/D contact structures 132, bonding semiconductor device 100 to a carrier substrate (not shown), and other suitable processes to form a backside power distribution network, the details of which may be omitted merely for clarity and ease of description. FIG. 18 illustrates a partial cross-sectional view along line D-D shown in FIG. 1 for semiconductor device 100 after deposition of flowable dielectric materials on a backside 100S2 of semiconductor device 100 or substrate 102. As shown in FIG. 18, gate structures 110, epitaxial fin regions 114, semiconductor layers 122, gate spacers 118G, ESL 126, and ILD layer 136 can be formed on a front-side 100S1 of semiconductor device 100 or substrate 102. Dummy epitaxial structure 1850, liner 1852, and backside interlayer dielectric (ILD) layer 1854 can be formed on backside 100S2 of semiconductor device 100 or substrate 102.

In some embodiments, dummy epitaxial structure 1850 can connect to epitaxial fin regions 114 and can be replaced with a backside contact structure in subsequent processes. In some embodiments, liner 1852 can have dielectric materials the same as ESL 126 and can protect layers under liner 1852 from oxidation. In some embodiments, backside ILD layer 1854 can include flowable dielectric materials the same as ILD layer 136 deposited by a flowable deposition method and followed by a low temperature microwave plasma treatment. In some embodiments, the flowable dielectric materials can include flowable silicon oxide, flowable silicon nitride, flowable silicon oxynitride, flowable silicon carbide, flowable silicon oxycarbide, and other suitable materials. In some embodiments the flowable dielectric materials can be deposited by FCVD or other suitable deposition methods. For example, the flowable dielectric materials can include flowable silicon oxide deposited by FCVD using silane ($SiH_4$) and oxygen ($O_2$) as reacting precursors. In some embodiments, on backside 100S2 of semiconductor device 100 or substrate 102, flowable dielectric materials can fill openings having a diameter from about 8 nm to about 20 nm and an aspect ratio from about 3 to about 10.

In some embodiments, the low temperature microwave plasma treatment can treat the flowable dielectric materials with plasma 1842 to form backside ILD layer 1854, as shown in FIG. 18. Plasma 1842 can include radicals the same as or similar to plasma 742. In some embodiments, plasma 1842 can include oxygen radicals. In some embodiments, plasma 1842 can include oxygen radicals and hydrogen radicals. A ratio of the oxygen radicals to the hydrogen radicals can range from about 95:5 to about 99:1 to improve densification of the flowable dielectric materials and increase an oxidation rate of plasma 1842. The low temperature microwave plasma treatment can be the same as or similar to the microwave plasma treatment treating flowable isolation material 606. In some embodiments, the low temperature microwave plasma treatment can be performed at a temperature from about 200° C. to about 400° C. under a pressure from about 0.5 torr to about 5 torr for about 2 min to about 10 min. A power level of the low temperature microwave plasma treatment can range from about 500 W to about 3000 W. In some embodiments, the temperature of the microwave plasma treatment on the flowable dielectric materials can range from about 300° C. to about 400° C. to further improve densification of the flowable dielectric materials. In some embodiments, the low temperature microwave plasma treatment can generate plasma 1842 from a mixture of oxygen, hydrogen, and an inert gas (e.g., argon or helium) in a way the same as or similar to the way to generate plasma 742.

In some embodiments, backside power rails and contacts can require low thermal budget dielectrics formed at a temperature lower than about 400° C. The device performance can be reduced if the temperature is greater than about 400° C. The low temperature microwave plasma treatment can provide low thermal budget dielectrics for semiconductor device 100 having advanced power distribution schemes. In some embodiments, the low temperature microwave plasma treatment for backside ILD layer 1854 can reduce under layer oxidation below liner 1852.

The formation of backside ILD layer 1854 can be followed by the formation of backside contact structure and other suitable processes to form semiconductor device 100 having a backside power distribution network, the details of which may be omitted merely for clarity and ease of description. Though the present disclosure describes forming STI regions 106, ILD layer 136, and backside ILD layer 1854 with flowable dielectric materials followed by the low temperature microwave plasma treatment, the methods of depositing flowable dielectric materials followed by the low temperature microwave plasma treatment can be applied to other suitable dielectric layers and dielectric structures.

Various embodiments in the present disclosure provide example methods for forming low thermal budget dielectrics (e.g., STI regions 106, ILD layer 136, backside ILD layer 1854) in semiconductor device 100. The example methods in the present disclosure can include forming first and second fin structures 108 with openings 506 on substrate 102 (shown in FIG. 5). Flowable isolation material 606 (e.g., flowable oxide) can fill openings 506 with a flowable deposition method. Flowable isolation material 606 can be treated with oxygen radicals of plasma 742 (shown in FIG. 7) at a low temperature from about 200° C. to about 500° C. In some embodiments, flowable isolation material 606 can be treated with a mixture of oxygen radicals and hydrogen radicals. Low thermal budget dielectrics (e.g., STI regions 106) can be formed by deposition of the flowable isolation material followed by the low temperature plasma treatment. In some embodiments, the low thermal budget dielectrics (e.g., STI regions 106) can reduce the presence of or have no voids or seams due to the flowable isolation material. In some embodiments, with the low temperature plasma treatment, the low thermal budget dielectrics (e.g., STI regions 106) can reduce defects, such as fin bending and Si and SiGe intermixing in stacked first and second semiconductor layers 120 and 122 of fin structures 108.

In some embodiments, a method includes forming, on a substrate. first and second fin structures with an opening in between, filling the opening with a flowable isolation material, treating the flowable isolation material with a plasma, and removing a portion of the plasma-treated flowable isolation material between the first and second fin structures.

In some embodiments, a method includes forming, on a substrate, first and second fin structures with an opening in between, filling the opening with a flowable isolation material, treating the flowable isolation material with a first plasma, forming a first epitaxial structure on the first fin structure and a second epitaxial structure on the second fin structure, forming an etch stop layer on the first and second epitaxial structures, and forming a dielectric layer on the etch stop layer and between the first and second epitaxial structures. The dielectric layer includes a flowable dielectric material. The method further includes treating the dielectric layer with a second plasma.

In some embodiments, a method includes forming on a first side of a substrate first and second fin structures with an opening in between, filling the opening with a first flowable isolation material, treating the first flowable isolation material with a first plasma, forming an epitaxial structure on the first and second fin structures, forming an etch stop layer on the epitaxial structure, and forming a dielectric layer on the etch stop layer. The dielectric layer includes a flowable dielectric material. The method further includes treating the dielectric layer with a second plasma, depositing a second flowable isolation material on a second side of the substrate, and treating the second flowable isolation material with a third plasma. The second side is opposite to the first side.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming, on a substrate, first and second stacks of semiconductor layers;
    depositing a flowable isolation material between the first and second stacks of semiconductor layers;
    densifying the deposited flowable isolation material with a plasma; and
    removing a portion of the densified flowable isolation material between the first and second stacks of semiconductor layers, wherein a top surface of the densified flowable isolation material is below bottom semiconductor layers of the first and second stacks of semiconductor layers.

2. The method of claim 1, wherein the densifying the deposited flowable isolation material with the plasma comprises:
    generating the plasma having a radical density from about $10^{10}$ cm$^{-3}$ to about $10^{15}$ cm$^{-3}$; and
    treating the flowable isolation material with the plasma.

3. The method of claim 1, wherein the densifying the deposited flowable isolation material with the plasma comprises:
    generating the plasma from oxygen and hydrogen, wherein the plasma comprises oxygen and hydrogen radicals; and
    treating the flowable isolation material with the oxygen and hydrogen radicals of the plasma.

4. The method of claim 1, wherein the depositing the flowable isolation material comprises depositing a flowable oxide on the substrate and the first and second stacks of semiconductor layers.

5. The method of claim 1, wherein the densifying the deposited flowable isolation material with the plasma comprises treating the flowable isolation material with the plasma under a temperature ranging from about 200° C. to about 500° C.

6. The method of claim 1, wherein the densifying the deposited flowable isolation material with the plasma comprises treating the flowable isolation material with the plasma for about 2 minutes to about 10 minutes.

7. The method of claim 1, wherein the densifying the deposited flowable isolation material with the plasma comprises treating the flowable isolation material with a plasma of oxygen and hydrogen radicals, a ratio of the oxygen radicals to the hydrogen radicals ranging from about 99:1 to about 95:5.

8. The method of claim 1, wherein the removing the portion of the densified flowable isolation material comprises:
    polishing the densified flowable isolation material; and
    etching the portion of the densified flowable isolation material between the first and second stacks of semiconductor layers.

9. A method, comprising:
    forming, on a substrate, first and second stacks of semiconductor layers adjacent to each other;
    depositing a first flowable isolation material between the first and second stacks of semiconductor layers;
    densifying the deposited first flowable isolation material;

forming a first epitaxial structure in contact with the first stack of semiconductor layers and a second epitaxial structure in contact with the second stack of semiconductor layers;

depositing an etch stop layer on the first and second epitaxial structures and the densified first flowable isolation material between the first and second epitaxial structures, wherein an opening forms between the etch stop layer on the first epitaxial structure and the etch stop layer on the second epitaxial structure;

depositing a second flowable isolation material between the first and second epitaxial structures to fill the opening, wherein a portion of the second flowable isolation material is below the first and second epitaxial structures; and densifying the deposited second flowable isolation material.

10. The method of claim 9, wherein the densifying the deposited first flowable isolation material and the densifying the deposited second flowable isolation material comprise:

generating first and second plasmas from oxygen, wherein the first and second plasmas comprise oxygen radicals;

treating the deposited first flowable isolation material with the oxygen radicals of the first plasma; and treating the deposited second flowable isolation material with the oxygen radicals of the second plasma.

11. The method of claim 9, wherein the densifying the deposited first flowable isolation material and the densifying the deposited second flowable isolation material comprise:

generating first and second plasmas from oxygen and hydrogen, wherein the first and second plasmas comprise oxygen radicals and hydrogen radicals;

treating the deposited first flowable isolation material with the oxygen radicals and hydrogen radicals of the first plasma; and treating the deposited second flowable isolation material with the oxygen radicals and hydrogen radicals of the second plasma.

12. The method of claim 9, wherein the densifying the deposited first flowable isolation material and the densifying the deposited second flowable isolation material comprise:

generating a first plasma having a radical density from about $10^{10}$ cm$^{-3}$ to about $10^{15}$ cm$^{-3}$;

treating the deposited first flowable isolation material with the first plasma;

generating a second plasma having a radical density from about $10^{10}$ cm$^{-3}$ to about $10^{15}$ cm$^{-3}$; and treating the deposited second flowable isolation material with the second plasma.

13. The method of claim 9, wherein the depositing the first flowable isolation material and the depositing the second flowable isolation material comprise depositing the first and second flowable isolation materials with a flowable chemical vapor deposition method.

14. The method of claim 9, wherein the densifying the deposited first flowable isolation material and the densifying the deposited second flowable isolation material comprise treating the first and second flowable isolation materials under a temperature ranging from about 200° C. to about 500° C.

15. The method of claim 9, wherein the densifying the deposited first flowable isolation material and the densifying the deposited second flowable isolation material comprise treating the first and second flowable isolation materials for about 2 minutes to about 10 minutes.

16. The method of claim 9, wherein the densifying the deposited first flowable isolation material and the densifying the deposited second flowable isolation material comprise treating the first and second flowable isolation materials with oxygen and hydrogen radicals, a ratio of the oxygen radicals to the hydrogen radicals ranging from about 99:1 to about 95:5.

17. A method, comprising:

forming, on a first side of a substrate, first and second stacks of semiconductor layers;

depositing a first flowable isolation material between the first and second stacks of semiconductor layers:

densifying the deposited first flowable isolation material within a temperature range;

removing a portion of the densified first flowable isolation material between the first and second stacks of semiconductor layers;

forming an epitaxial structure on the first and second stacks of semiconductor layers;

forming an etch stop layer on the epitaxial structure and the densified first flowable isolation material;

depositing a second flowable isolation material on the etch stop layer;

densifying the deposited second flowable isolation material within the temperature range;

depositing a third flowable isolation material on a second side of the substrate, wherein the second side is opposite to the first side; and densifying the deposited third flowable isolation material within the temperature range.

18. The method of claim 17, wherein the densifying the deposited first flowable isolation material, the deposited second flowable isolation material, and the deposited third flowable isolation material comprise:

generating first, second, and third plasmas from oxygen, wherein the first, second, and third plasmas comprise oxygen radicals; and treating the deposited first flowable isolation material, the deposited second flowable isolation material, and the deposited third flowable isolation material with the oxygen radicals.

19. The method of claim 17, wherein the densifying the deposited first flowable isolation material, the deposited second flowable isolation material, and the deposited third flowable isolation material comprise:

generating first, second, and third plasmas from oxygen and hydrogen, wherein the first, second, and third plasmas comprise oxygen and hydrogen radicals; and treating the deposited first flowable isolation material, the deposited second flowable isolation material, and the deposited third flowable isolation material with the oxygen and hydrogen radicals.

20. The method of claim 17, wherein the temperature range is from about 200° C. to about 500° C.

* * * * *